(12) United States Patent
Kurihara et al.

(10) Patent No.: US 7,723,235 B2
(45) Date of Patent: May 25, 2010

(54) METHOD FOR SMOOTHING A RESIST PATTERN PRIOR TO ETCHING A LAYER USING THE RESIST PATTERN

(75) Inventors: Masaru Kurihara, Kawasaki (JP); Masaru Izawa, Hino (JP)

(73) Assignee: Renesas Technology Corp., Tokyo (JP)

( * ) Notice: Subject to any disclaimer, the term of this patent is extended or adjusted under 35 U.S.C. 154(b) by 379 days.

(21) Appl. No.: 11/571,853

(22) PCT Filed: Jun. 10, 2005

(86) PCT No.: PCT/JP2005/013230

§ 371 (c)(1),
(2), (4) Date: Jan. 9, 2007

(87) PCT Pub. No.: WO2006/030581

PCT Pub. Date: Mar. 23, 2006

(65) Prior Publication Data
US 2008/0045022 A1 Feb. 21, 2008

(30) Foreign Application Priority Data
Sep. 17, 2004 (JP) .............................. 2004-270670

(51) Int. Cl.
*H01L 21/311* (2006.01)
*H01L 21/3065* (2006.01)
(52) U.S. Cl. ..................... 438/694; 438/706; 438/710; 438/719; 438/720; 438/725; 216/41; 216/67
(58) Field of Classification Search ................. 438/706, 438/710, 714, 719, 720, 723, 724, 725; 216/41, 216/67
See application file for complete search history.

(56) References Cited

U.S. PATENT DOCUMENTS 5,928,840 A * 7/1999 Matsuo et al. .............. 430/324

(Continued)

FOREIGN PATENT DOCUMENTS

JP 10-004084 1/1998

(Continued)

OTHER PUBLICATIONS

Chinese Official Action for Application No. 2005800232671, dated Feb. 1, 2008.

(Continued)

*Primary Examiner*—Shamim Ahmed
(74) *Attorney, Agent, or Firm*—Antonelli, Terry, Stout & Kraus, LLP.

(57) ABSTRACT

After a polycrystalline silicon film (5) is formed on a semiconductor substrate via an insulating film for a gate insulating film (step S1), an organic antireflection film (21) is formed on the polycrystalline silicon film (5) (step S2), and a resist pattern (22) is formed on the antireflection film (21) (step S3). Then, a passivation film (23) is deposited on the antireflection film (21) so as to cover the resist pattern (22) by plasma using fluorocarbon gas while a bias voltage is being applied to the semiconductor substrate (step S4). Then, the passivation film (23) and the antireflection film (21) are etched by plasma using gas containing oxygen gas (step S5). Thereafter, the polycrystalline silicon film (5) is etched using the resist pattern (22) with reduced line edge roughness as an etching mask to form a gate electrode (step S6).

10 Claims, 32 Drawing Sheets

U.S. PATENT DOCUMENTS

| | | | |
|---|---|---|---|
| 6,514,672 B2 * | 2/2003 | Young et al. | 430/314 |
| 6,764,946 B1 * | 7/2004 | Amblard | 438/637 |
| 6,811,956 B1 * | 11/2004 | Gabriel | 430/313 |
| 2004/0038549 A1 * | 2/2004 | Arita | 438/725 |
| 2005/0277289 A1 * | 12/2005 | Wagganer et al. | 438/637 |
| 2006/0266478 A1 * | 11/2006 | Lee et al. | 156/345.24 |

FOREIGN PATENT DOCUMENTS

| | | | |
|---|---|---|---|
| JP | 10-4084 | * | 1/1998 |
| JP | H10-004084 | | 1/1998 |
| JP | H10-098023 | | 4/1998 |
| JP | 11-195641 | | 7/1999 |
| JP | 2000-164571 | | 6/2000 |
| JP | 2002-231608 | | 8/2002 |
| JP | 2002-289592 | | 10/2002 |
| JP | 2002-319573 | | 10/2002 |
| JP | 2004-247444 | | 9/2004 |

OTHER PUBLICATIONS

M. Kurihara, et al., "Reduction Technique of Line-Edge Roughness Independent of CD Shift in Gate Etching Process" Proceedings of $4^{th}$ International Symposium on Dry Process, pp. 7-12, Nov. 2004.

Y.S. Chae, et al., "Control of Surface Morphology and Etch Selectivity Using Fluorocarbon Film During Dry Etching", Proceedings of $4^{th}$ International Symposium on Dry Process, pp. 13-17, Nov. 2004.

Office Action in Japanese Patent Appln. Ser. No. 2006-535065 (in Japanese), dispatch date: Jul. 14, 2009, pp. 1-7.

* cited by examiner

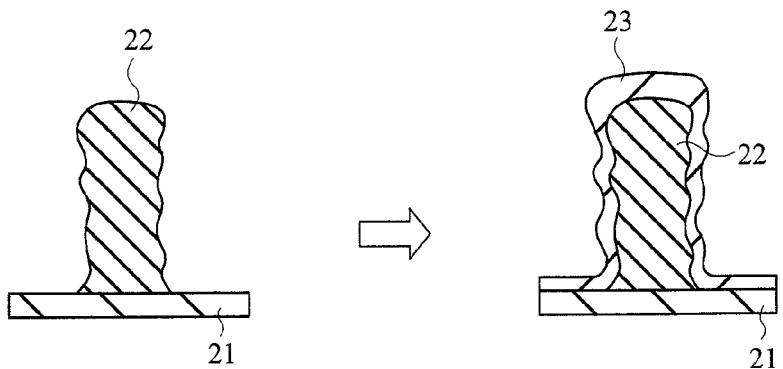
FIG. 12A
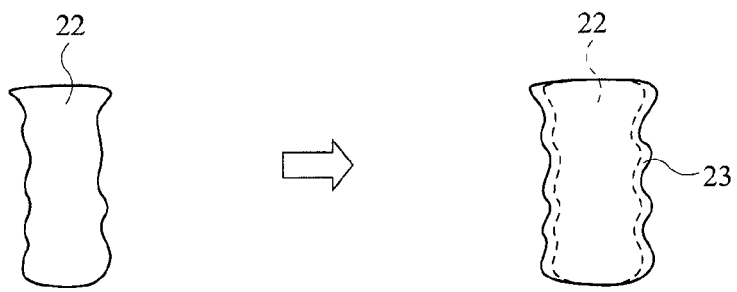
FIG. 12B
FIG. 13
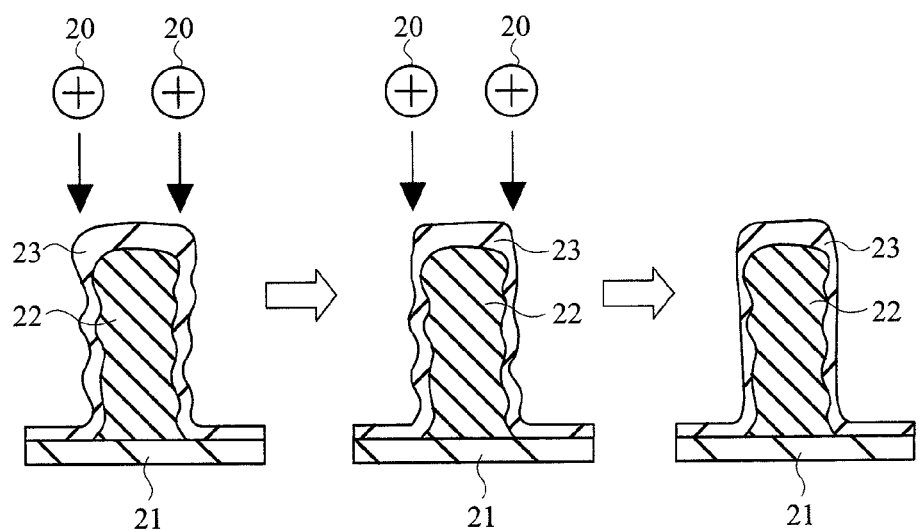

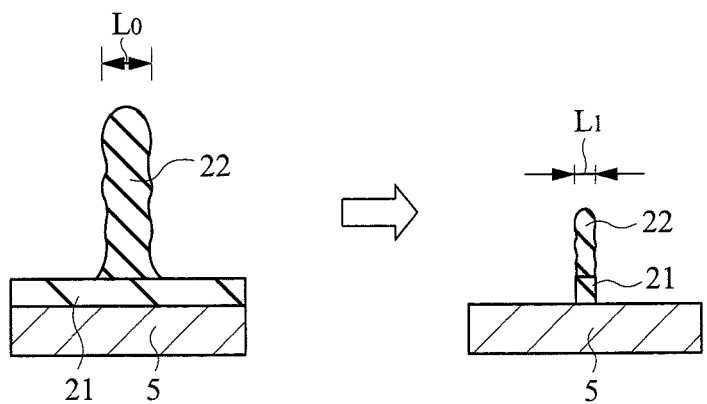
FIG. 18A
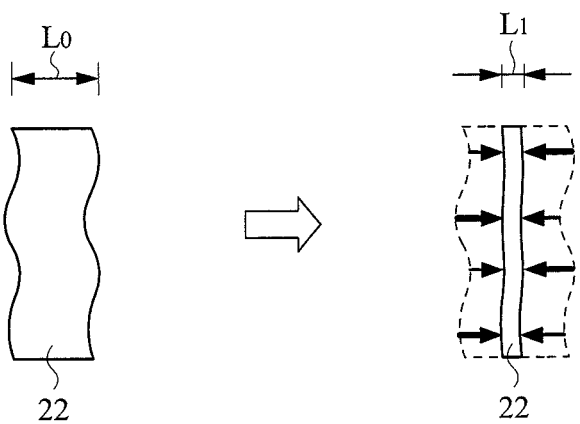
FIG. 18B
FIG. 19
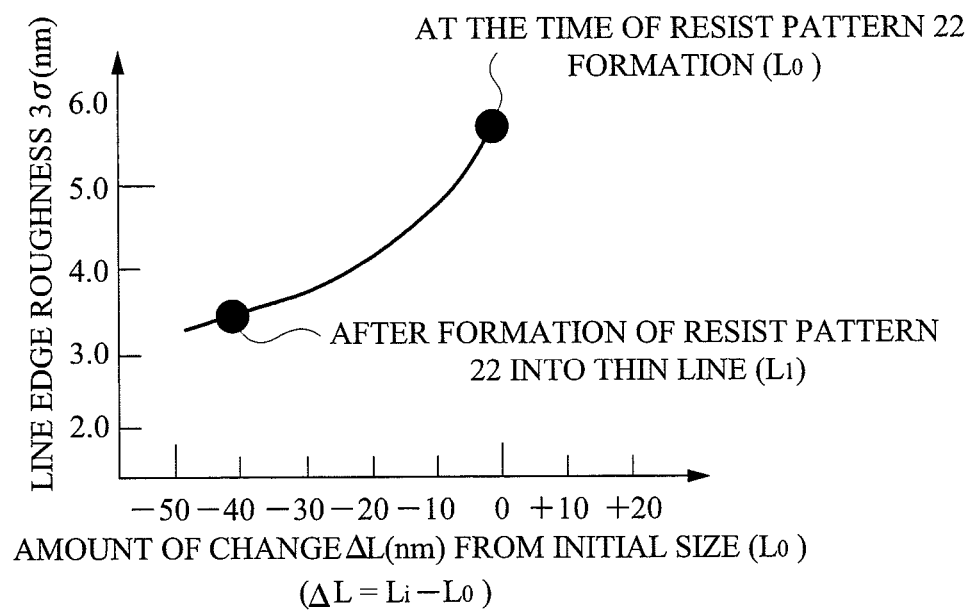

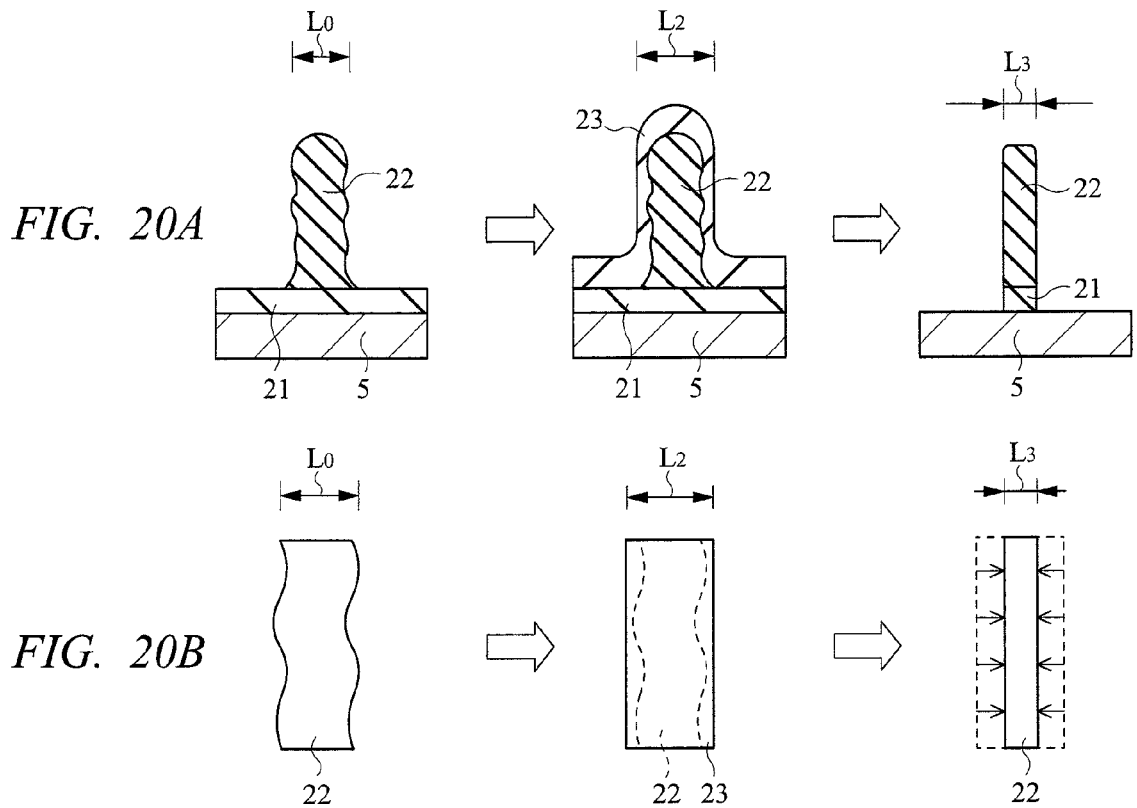
FIG. 20A
FIG. 20B
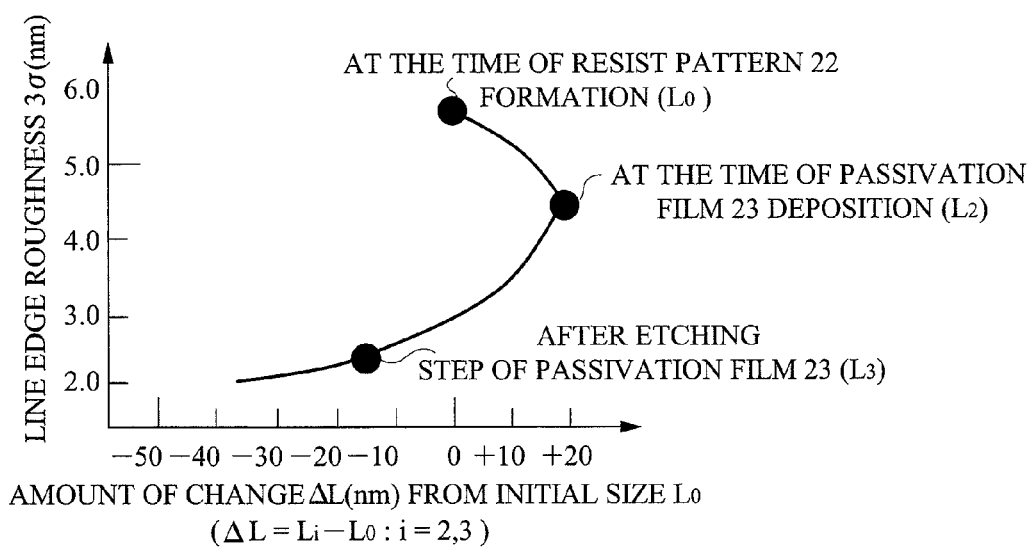
FIG. 21 ized high-speed logic device following the 90-nm node, lithography using ArF excimer laser (ArF lithography) with a light source wavelength of 193 nm is used to form a fine gate electrode having a wire width of 50 nm or less. This resist for the ArF lithography tends to cause problems of thinning due to strength lowering of material thereof, resist shape abnormality or lowering of resist selection ratio due to lowering of etching resistance, and line edge roughness due to organic polymer which is resist material, which is different from resist for lithography using a conventional KrF excimer laser (KrF lithography).

METHOD FOR SMOOTHING A RESIST PATTERN PRIOR TO ETCHING A LAYER USING THE RESIST PATTERN

TECHNICAL FIELD

The present invention relates to a semiconductor device manufacturing method, and in particular to a technique suitable for applying to a semiconductor device manufacturing method that has a step of etching a layer to be processed using a resist pattern as an etching mask.

BACKGROUND ART

As a method for forming a gate electrode of a MISFET in a semiconductor device, there is a dry etching method using a resist pattern as an etching mask. The dry etching method is a technique for making process gas introduced in a vacuum case become plasma utilizing high-frequency power applied externally to cause reactive radical or ion produced in the plasma to react on a wafer at high precision, thereby selectively processing a silicon film which is a film to be processed on mask material or a gate insulating film as typified by resist.

Japanese Patent Application Laid-Open Publication No. 2002-289592 (Patent Document 1) describes a technique where a constitution for etching and removing a antireflection film of an opening portion of resist using etching gas containing halogen substitution of carbon hydride as component is adopted, so that when the antireflection film is etched, carbon component in the halogen substitution of carbon hydride is formed as carbonaceous deposit on sidewalls of the opening portion of the resist which is subjected to reduced ion irradiation and sidewalls of an opening portion which is formed according to the etching of the antireflection film, and the deposit serves as a sidewall passivation film, so that lateral spreading of the opening portion of the resist and the opening portion of the antireflection film due to etching is suppressed, thereby enabling anisotropic etching of the antireflection film.

Japanese Patent Application Laid-Open Publication No. 2000-164571 (Patent Document 2) describes a technique regarding a contact hole forming method including a step of forming an insulating film (an interlayer insulating film) on a conductive layer (a semiconductor substrate), a step of forming a resist film on the insulating film, a step of performing exposure and development of the resist film for providing an opening in the resist film, a step of performing a first etching utilizing the resist film as a mask to remove at least a portion of the insulating film while depositing reaction product of etching gas on the resist film surface, and a step of performing a second etching different in etching condition from the first etching to open a contact hole reaching the conductive layer.

Japanese Patent Application Laid-Open Publication No. 10-4084 (Patent Document 3) describes a technique for achieving etching excellent in anisotropy by, after forming a resist film on a metal film on a substrate in a first step, patterning the resist film by lithography technique to form a resist pattern, and after forming a passivation film on a surface of the resist pattern by plasma process using gas of fluorocarbon based in a second step, etching the metal film using the resist pattern on which the passivation film has been formed as an etching mask in a third step.

Japanese Patent Application Laid-Open Publication No. 11-195641 describes a technique of alternately performing an etching step using $SF_6$ gas and a deposition step using $C_4F_8$ plural times to form a deep groove in silicon by high-rate etching using silicon oxide as a mask.

Patent Document 1: Japanese Patent Application Laid-Open Publication No. 2002-289592
Patent Document 2: Japanese Patent Application Laid-Open Publication No. 2000-164571
Patent Document 3: Japanese Patent Application Laid-Open Publication No. 10-4084
Patent Document 4: Japanese Patent Application Laid-Open Publication No. 11-195641

DISCLOSURE OF THE INVENTION

The following problem was found according to study by the present inventors.

Recently, according to a demand for size reduction or high integration of a semiconductor device, scaling of a semiconductor device, for example, scaling of a gate electrode or the like is required. For example, in a step for manufacturing a highly-integrated high-speed logic device following the 90-nm node, lithography using ArF excimer laser (ArF lithography) with a light source wavelength of 193 nm is used to form a fine gate electrode having a wire width of 50 nm or less. This resist for the ArF lithography tends to cause problems of thinning due to strength lowering of material thereof, resist shape abnormality or lowering of resist selection ratio due to lowering of etching resistance, and line edge roughness due to organic polymer which is resist material, which is different from resist for lithography using a conventional KrF excimer laser (KrF lithography).

FIG. 71 to FIG. 75 are explanatory views for explaining the problem to be solved by the present invention. As shown on a plan view shown in FIG. 71, the line edge roughness indicates undulation of a pattern edge of a resist pattern 102 when the resist pattern 102 formed on a foundation layer 101 is observed from above, where a variation (3σ) of the undulation is an indicator. As shown on a sectional view in FIG. 72, since it is considered that the line edge roughness is caused by variations in polymer size of resist material, undulation principally appears on a sidewall of the resist pattern 102 even when the resist pattern 102 is viewed from its section. In addition, as shown in FIG. 73, when the line edge roughness is subjected to wavelength analysis according to Fourier transform, it is found that various wavelength components are contained. Since the resist pattern 102 is used as an etching mask at a time of gate electrode process, line edge roughness of the resist pattern 102 is principally transferred on the gate electrode.

The line edge roughness of the gate electrode generated by reflecting the line edge roughness of the resist pattern 102 causes lowering of device performance and a productivity lowering (lowering of manufacturing yield) due to variations of device performance. Influence of the lowering varies according to a wavelength of the edge line roughness. For example, as shown in FIG. 74, when a wavelength (λ) of line edge roughness occurring in a gate electrode 103 is smaller than a size ($W_1$) of an active region 104 forming source/drain of a semiconductor substrate (namely, in case of λ<$W_1$), a leakage current increases at a portion where a gate length is short. Therefore, standby energy increases, which is one of causes of transistor performance lowering. As shown in FIG. 75, when the wavelength (λ) of line edge roughness occurring in the gate electrode 103 is larger than the size ($W_1$) of the active region 104 forming source/drain of a semiconductor substrate (namely, in case of λ>$W_1$), variations in gate length occur among transistors, so that variations of transistor performance occurs, which is one of causes of productivity lowering (manufacturing yield lowering).

Therefore, it is desired to reduce the line edge roughness of a gate electrode or the like. For example, in a gate electrode with a wire width of 37 nm in the 90-nm node, it is desired that the line edge roughness is 3 nm or less. In a gate electrode formation using a resist pattern formed by using ArF lithography, a technique for reducing the line edge roughness is especially important.

Japanese Patent Application Laid-Open Publication No. 2002-289592 and Japanese Patent Application Laid-Open Publication No. 2000-164571 describe methods for controlling a size of a resist pattern using a sedimentary passivation film. The methods are both for controlling a process size of a pattern and it is not directed to reduction of line edge roughness.

In the technique described in Japanese Patent Application Laid-Open Publication No. 10-4084, a passivation film is formed on a surface of a resist pattern and a metal interconnect is formed by etching a metallic film using the resist pattern on which the passivation film has been formed as an etching mask at a metal interconnect process step, but the passivation film is used as the etching mask, where lowering of the line edge roughness is not considered.

Japanese Patent Application Laid-Open Publication No. 11-195641 describes a method for etching silicon at high rate in a process of a silicon groove with a high aspect ratio by alternately performing formation of a passivation film at a deposition step and processing of silicon at an etching step multiple times using silicon oxide as a mask. However, the passivation film is a passivation film for protection for silicon oxide serving as a mask and for suppressing abnormal shape such as undercut of silicon, where reduction of the line edge roughness is not considered.

An object of the present invention is to provide a technique which enables improvement of a performance of a semiconductor device.

The above and other objects and novel characteristics of the present invention will be apparent from the description of this specification and the accompanying drawings.

The typical ones of the inventions disclosed in this application will be briefly described as follows.

According to an aspect of the present invention, there is provided: a step of forming a resist pattern on a layer to be processed of the semiconductor substrate having the layer to be processed; a step of forming a first material film on the layer to be processed so as to cover the resist pattern; and a step of removing at least one portion of the first material film; and thereafter a step of etching the layer to be processed utilizing the resist pattern and a remaining portion of the first material film as an etching mask.

The effects obtained by typical aspects of the present invention will be briefly described below.

According to the present invention, the performance of a semiconductor device can be improved.

BRIEF DESCRIPTIONS OF THE DRAWINGS

FIG. 12 shows explanatory views for explaining a case where no bias voltage is applied to a semiconductor substrate (a wafer) at a deposition step of a passivation film;

FIG. 13 is an explanatory view for explaining a case where a bias voltage is applied to the semiconductor substrate (a wafer) at the deposition step of the passivation film;

FIG. 18 shows explanatory views illustratively showing an aspect where an antireflection film is etched and a resist pattern is also etched to be formed in a thin line in the first comparative example;

FIG. 19 is a graph showing a relationship between the amount of change of a resist pattern from its initial size and line edge roughness of the resist pattern in the first comparative example;

FIG. 20 shows explanatory views illustratively showing an aspect where after a resist pattern is formed, deposition of a passivation film is performed and the resist pattern is formed in a thin line by etching the passivation film and an antireflection film according to the present embodiment;

FIG. 21 is a graph showing a relationship between the amount of change of a resist pattern from its initial size and line edge roughness of the resist pattern in the present embodiment;

Figure 45:
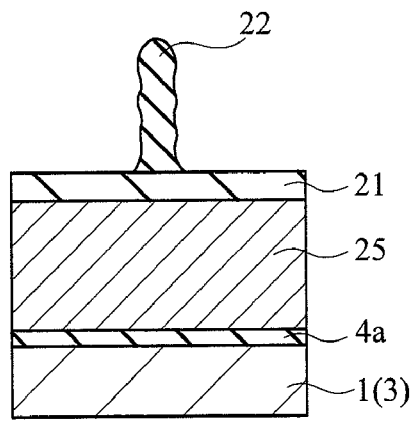
FIG. 45 is a sectional view of a main part during a gate electrode formation step of the seventh embodiment of the present invention.
Figure 46:
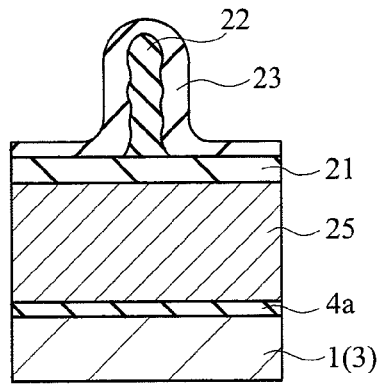
Figure 47:
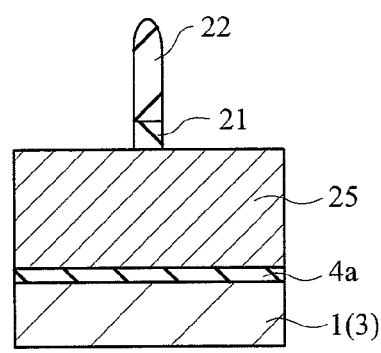
Figure 48:
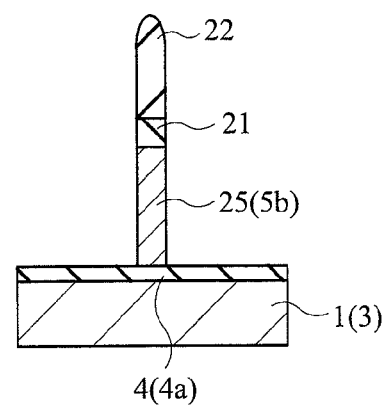
Figure 49:
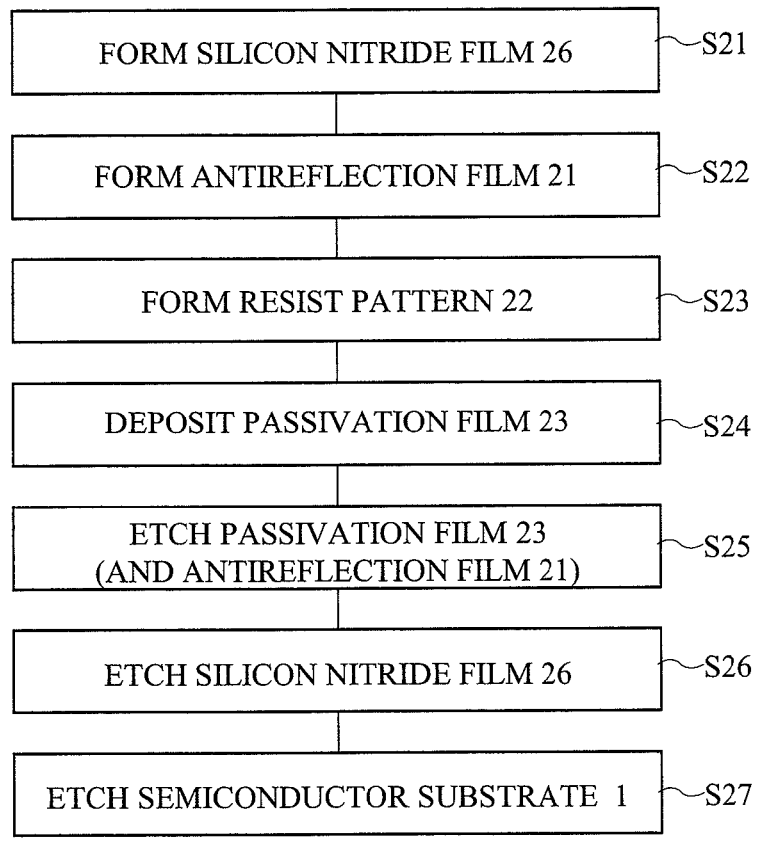
Figure 50:
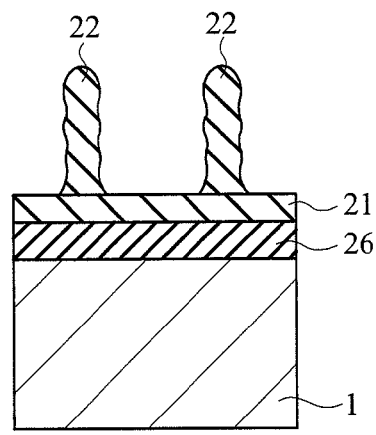
Figure 51:
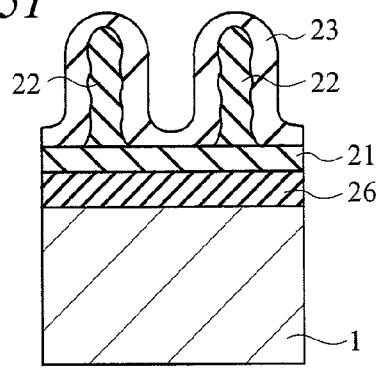
Figure 52:
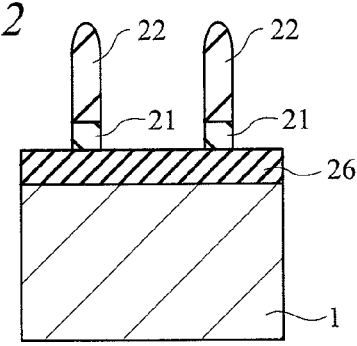
Figure 53:
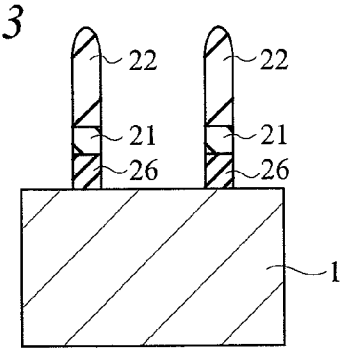
Figure 54:
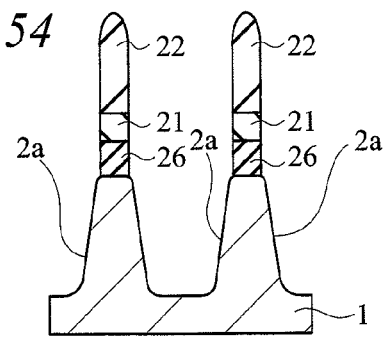
Figure 55:
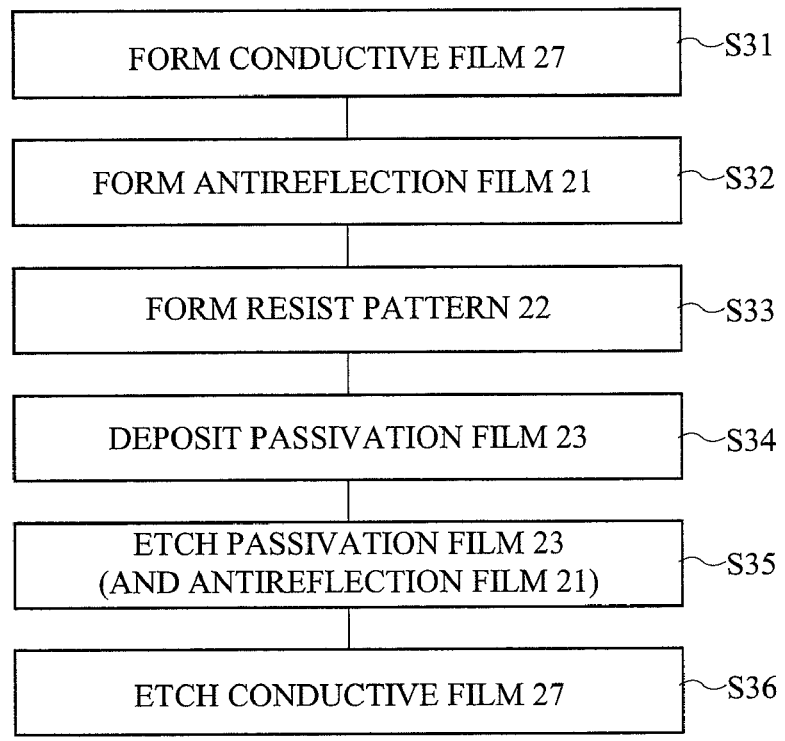
Figure 56:
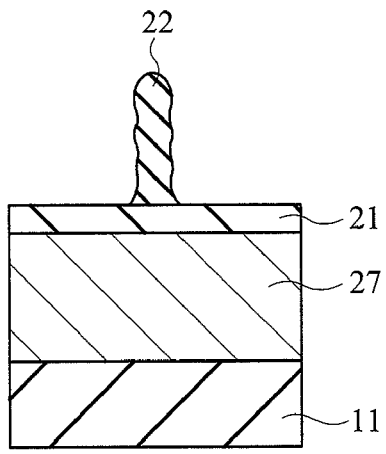
Figure 57:
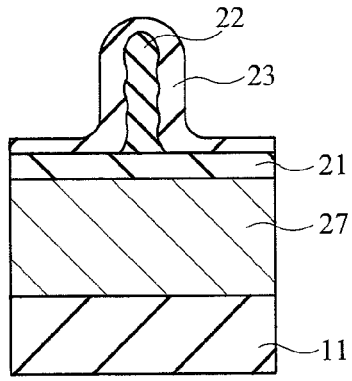
Figure 58:
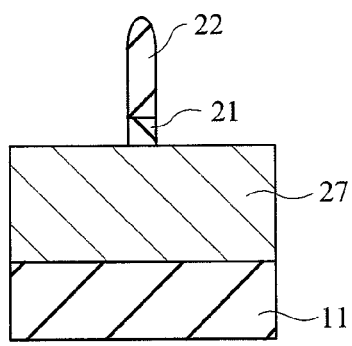
Figure 59:
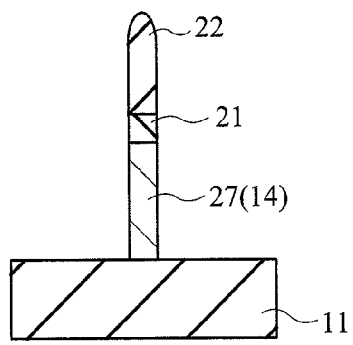
Figure 60:
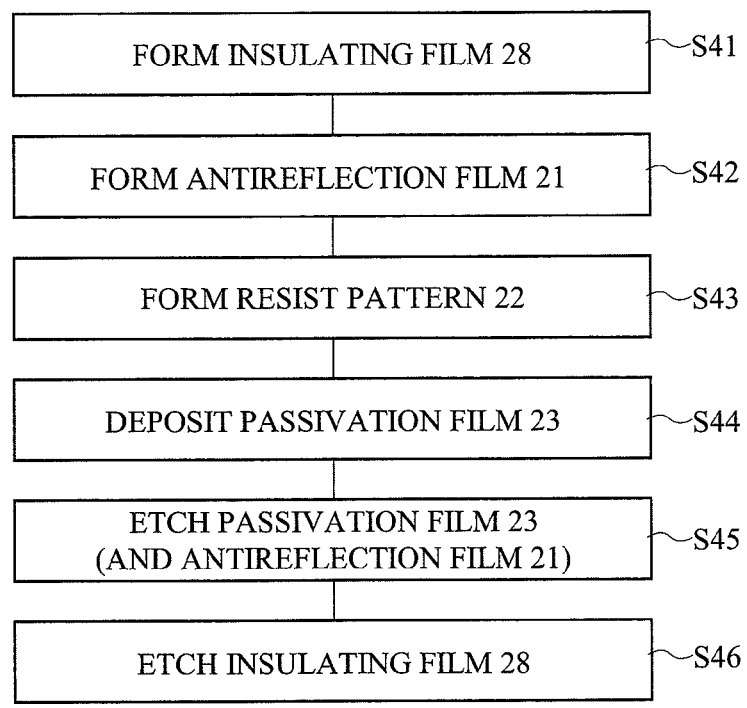
Figure 61:
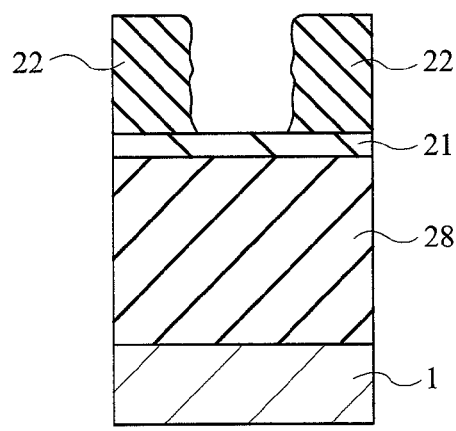
Figure 62:
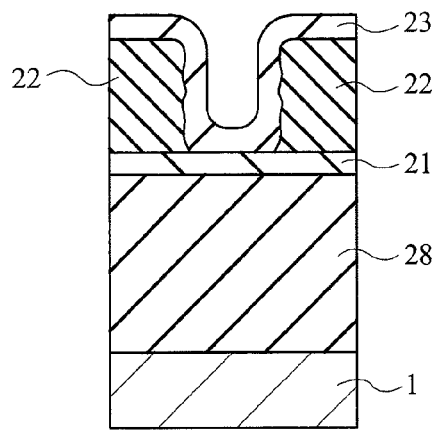
Figure 63:
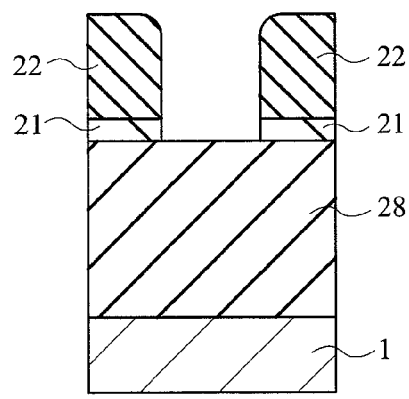
Figure 64:
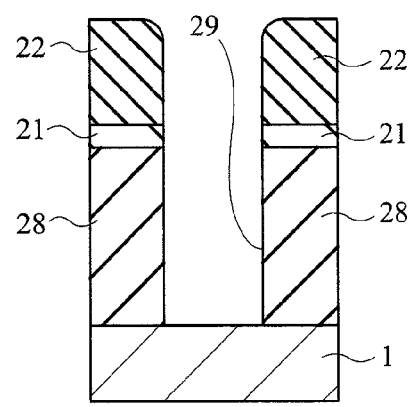
Figure 65:
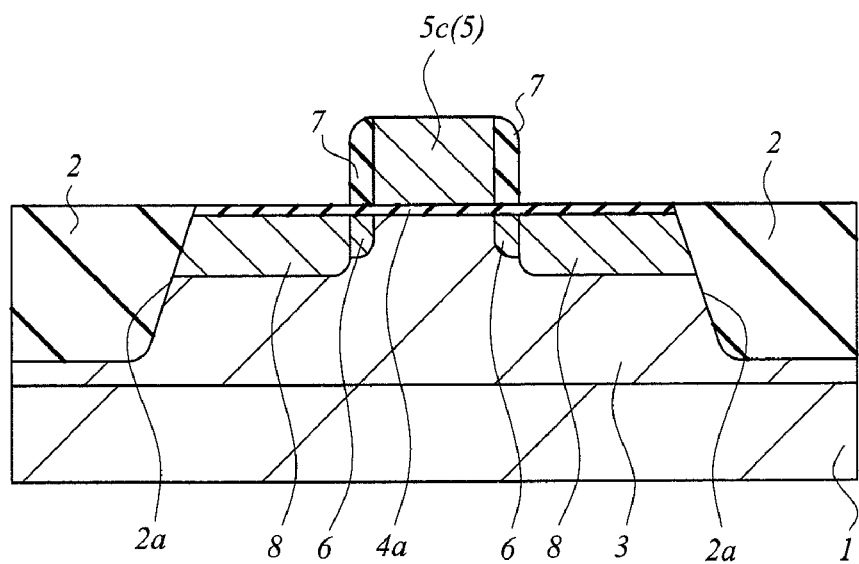
Figure 66:
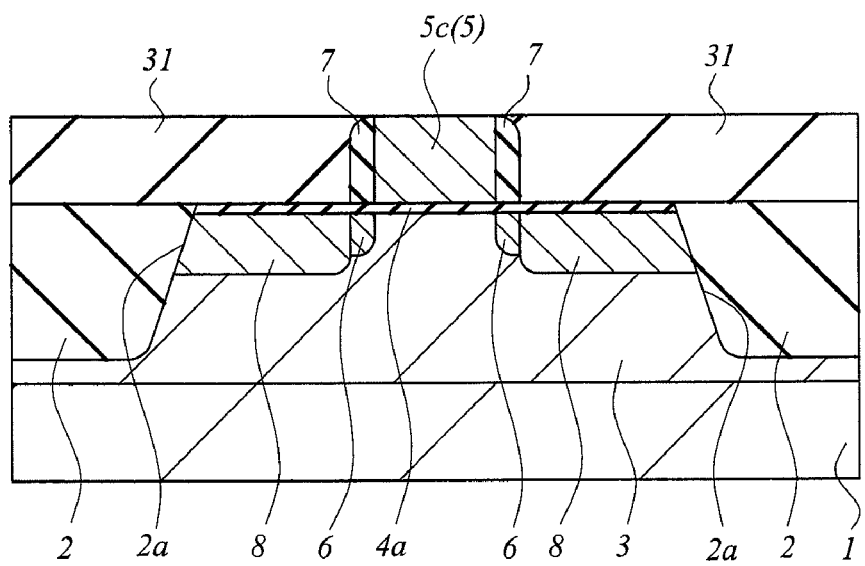
Figure 67:
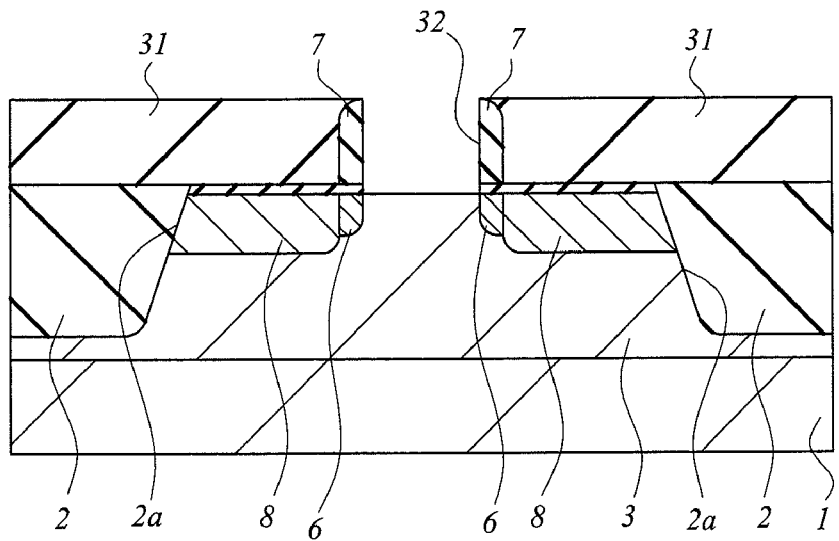
Figure 68:
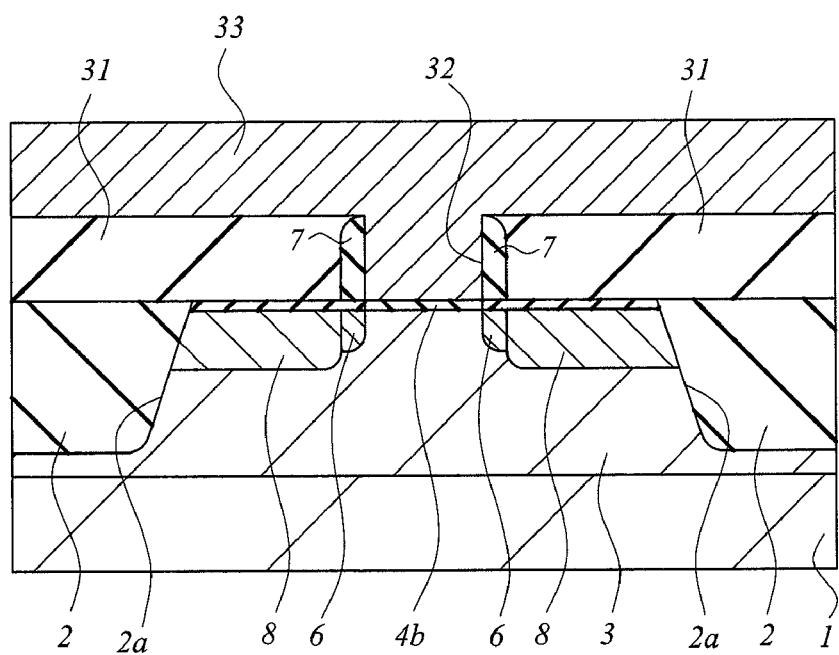
Figure 69:
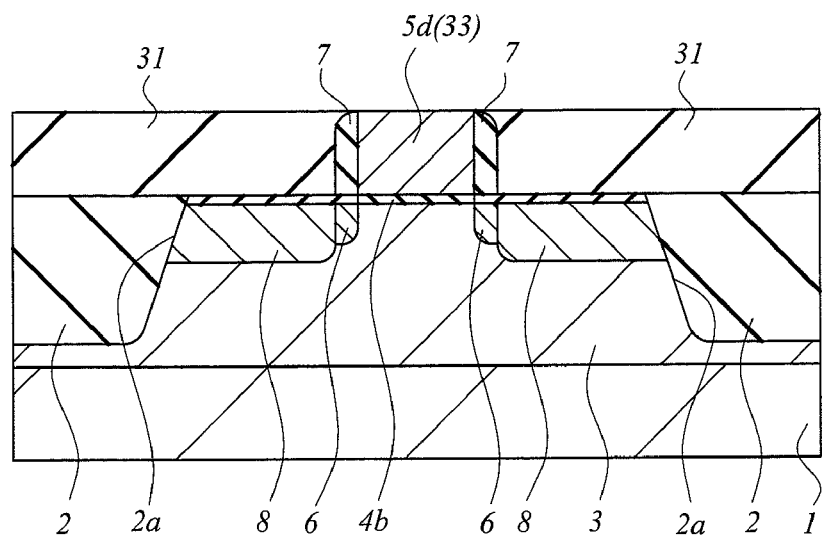
Figure 70:
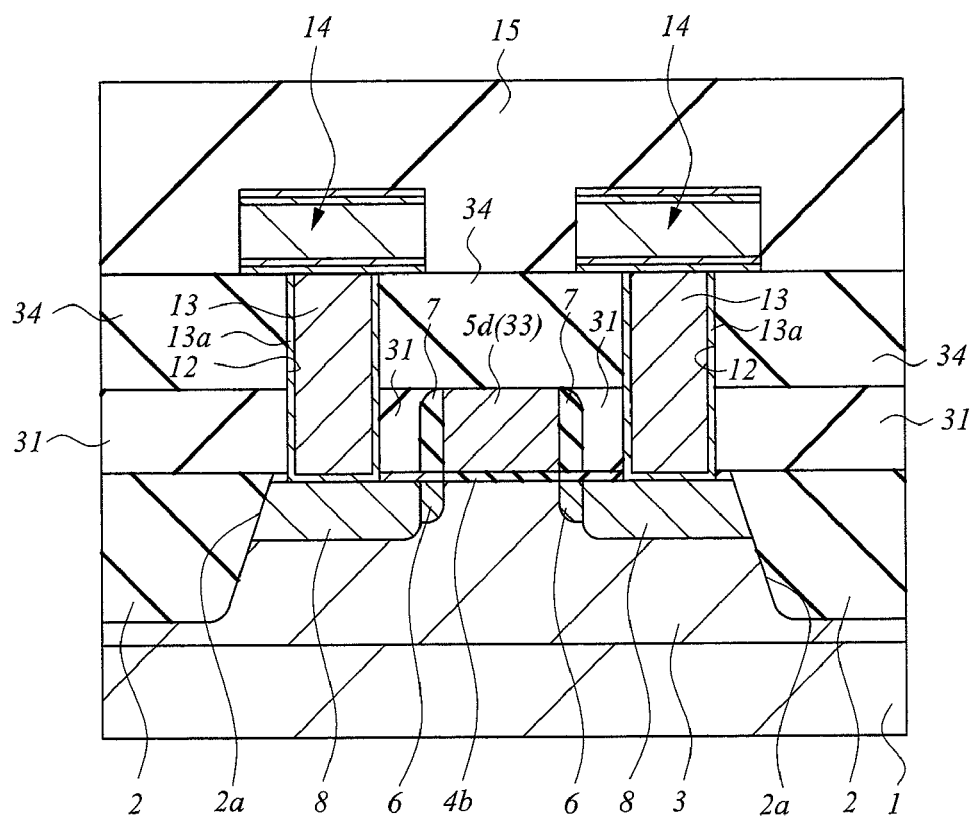
Figure 71:
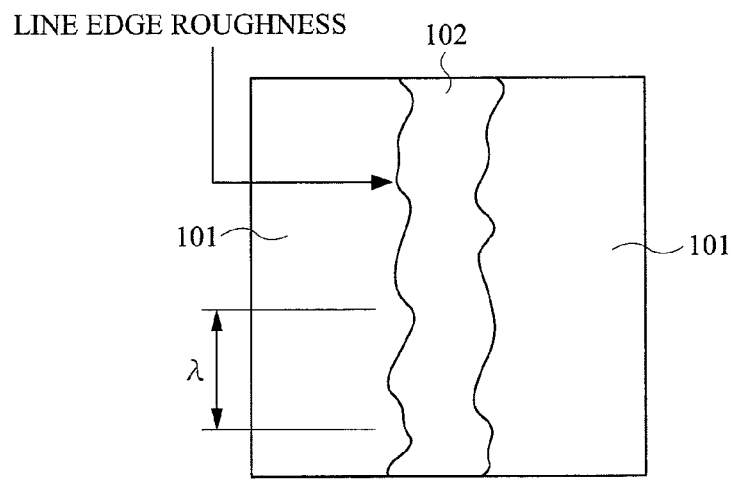
Figure 72:
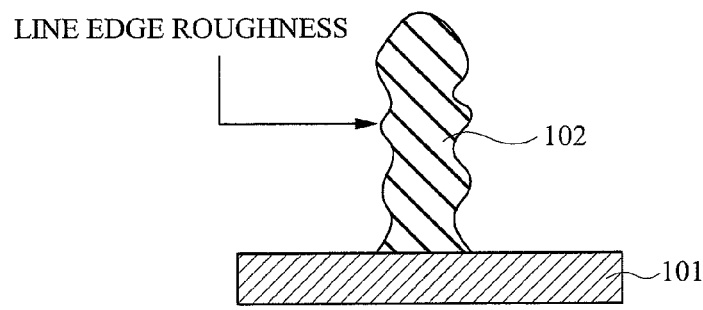
Figure 73:
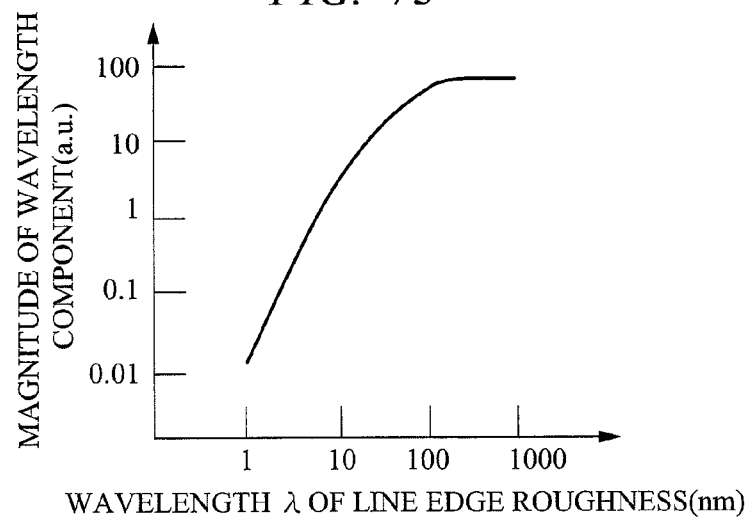
Figure 74:
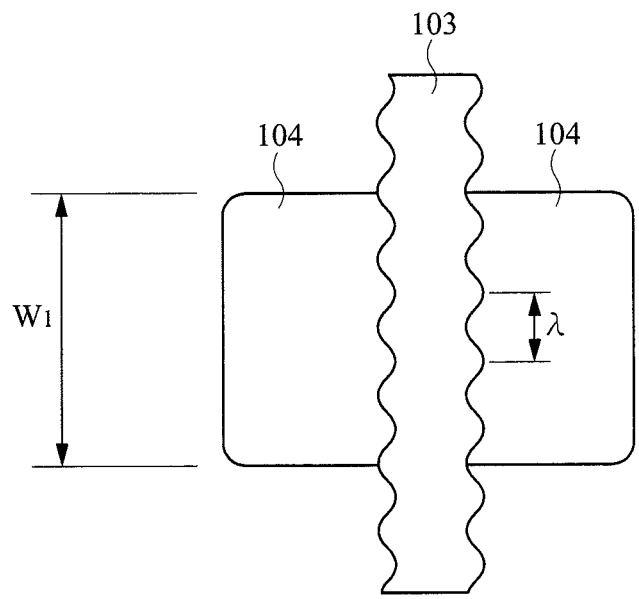
Figure 75:
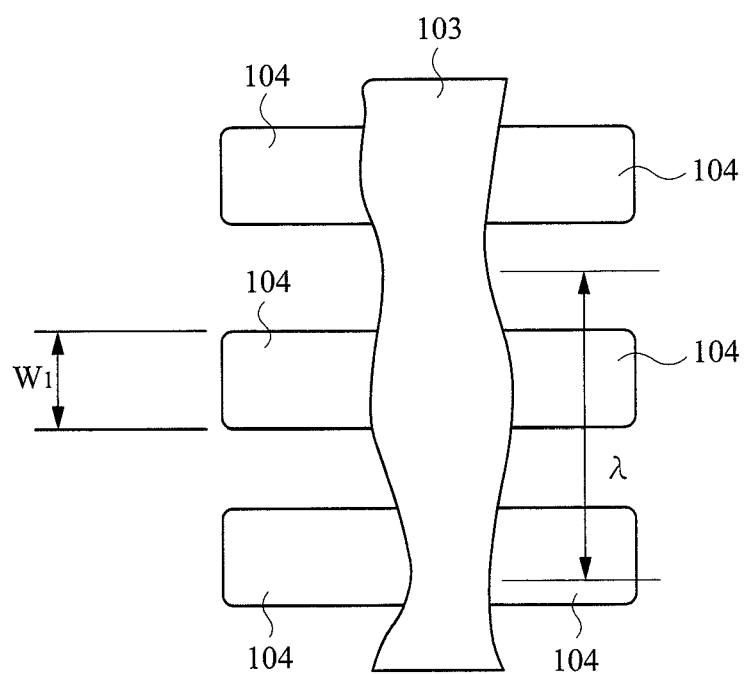

FIG. 46 a sectional view of the main part during a gate electrode formation step following the step shown in FIG. 45;

FIG. 47 is a sectional view of the main part during a gate electrode formation step following the step shown in FIG. 46;

FIG. 48 is a sectional view of the main part during a gate electrode formation step following the step shown in FIG. 47;

FIG. 49 is a process flowchart of a device isolation trench formation step of an eighth embodiment of the present invention;

FIG. 50 is a sectional view of a main part during a device isolation trench formation step of the eight embodiment of the present invention;

FIG. 51 is a sectional view of the main part during a device isolation trench formation step following the step shown in FIG. 50;

FIG. 52 is a sectional view of the main part during a device isolation trench formation step following the step shown in FIG. 51;

FIG. 53 is a sectional view of the main part during a device isolation trench formation step following the step shown in FIG. 52;

FIG. 54 is a sectional view of the main part during a device isolation trench formation step following the step shown in FIG. 53;

FIG. 55 is a process flowchart of an interconnect formation step of a ninth embodiment of the present invention;

FIG. 56 is a sectional view of a main part during an interconnect formation step of the ninth embodiment of the present invention;

FIG. 57 is a sectional view of the main part during an interconnect formation step following the step shown in FIG. 56;

FIG. 58 is a sectional view of the main part during an interconnect formation step following the step shown in FIG. 57;

FIG. 59 is a sectional view of the main part during an interconnect formation step following the step shown in FIG. 58;

FIG. 60 is a process flowchart of an opening portion formation step of a tenth embodiment of the present invention;

FIG. 61 is a sectional view of a main part during an opening portion formation step according to the tenth embodiment of the present invention;

FIG. 62 is a sectional view of the main part during an opening portion formation step following the step shown in FIG. 61;

FIG. 63 is a sectional view of the main part during an opening portion formation step following the step shown in FIG. 62;

FIG. 64 is a sectional view of the main part during an opening portion formation step following the step shown in FIG. 63;

FIG. 65 is a sectional view of a main part during a manufacturing step of a semiconductor device of an eleventh embodiment of the present invention;

FIG. 66 is a sectional view of the main part during a manufacturing step of the semiconductor device following the step shown in FIG. 65;

FIG. 67 is a sectional view of the main part during a manufacturing step of the semiconductor device following the step shown in FIG. 66;

FIG. 68 is a sectional view of the main part during a manufacturing step of the semiconductor device following the step shown in FIG. 67;

FIG. 69 is a sectional view of the main part during a manufacturing step of the semiconductor device following the step shown in FIG. 68;

FIG. 70 is a sectional view of the main part during a manufacturing step of the semiconductor device following the step shown in FIG. 69;

FIG. 71 is an explanatory view of a problem to be solved by the present invention;

FIG. 72 is an explanatory view of the problem to be solved by the present invention;

FIG. 73 is an explanatory view of the problem to be solved by the present invention;

FIG. 74 is an explanatory view of the problem to be solved by the present invention; and FIG. 75 is an explanatory view of the problem to be solved by the present invention.

BEST MODE FOR CARRYING OUT THE INVENTION

Hereinafter, embodiments of the present invention will be described in detail with reference to the accompanying drawings. Note that components having the same function are denoted by the same reference symbols throughout the drawings for describing the present embodiment, and the repetitive description thereof will be omitted.

In the drawings used for describing embodiments, hatching may be omitted to facilitate visualization even in the sectional view. Hatching may be used to facilitate visualization even in the plan view.

First Embodiment

A semiconductor device manufacturing step of a present embodiment will be explained with reference to the drawings. FIG. 1 to FIG. 6 are sectional views of a main part during a manufacturing step of a semiconductor device, for example, a MISFET (metal insulator semiconductor field effect transistor), according to an embodiment of the present invention.

Figure 1:
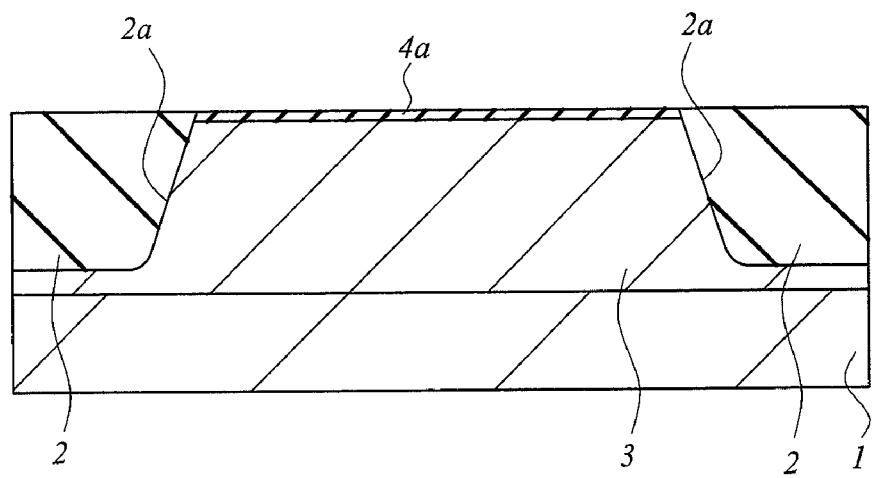
FIG. 1 is a sectional view of a main part during a manufacturing step of a semiconductor device according to an embodiment of the present invention.

As shown in FIG. 1, a semiconductor substrate (a semiconductor wafer) 1 made from, for example, p-type monocrystalline silicon with a resistivity of about 1 to 10 Ωm is prepared and a device isolation region 2 is formed on a principal surface of the semiconductor substrate 1. The device isolation region 2 is composed of, for example, an insulating film such as a silicone oxide film embedded in a device isolation trench 2a formed on the semiconductor substrate 1 and it can be formed, for example, by an STI (shallow trench isolation) process or the like. The device isolation region 2 can also be formed by an LOCOS (local oxidization of silicon) process or the like.

Next, a p-type well 3 is formed on a region of the semiconductor substrate 1 on which an n-channel type MISFET is formed. The p-type well 3 is formed by ion-implanting p-type impurities such as boron (B) or the like.

Next, an insulating film 4a for gate insulating film formation is formed on a surface of the p-type well 3. The insulating film 4a is made of, for example, a thin silicon oxide film and it may be formed, for example, by a thermal oxidation method. A silicon oxynitride film may be used as the insulating film 4a for gate insulating film formation. For example, so-called High-k film (high dielectric film) such as hafnium oxide ($HfO_2$), hafnium aluminate ($HfAlO_x$), hafnium silicate ($HfSiO_x$), zirconia (zirconium oxide), zirconium aluminate ($ZrAlO_x$) zirconium silicate ($ZrSiO_x$), lanthanum oxide ($La_2O_3$), or lanthanum silicate ($LaSiO_x$) can be used as the insulating film 4a for gate insulating film formation.

Next, a gate electrode 5a is formed on the insulating film 4a of the p-type well 3. For example, the gate electrode 5a can be formed in the following manner.

Figure 2:
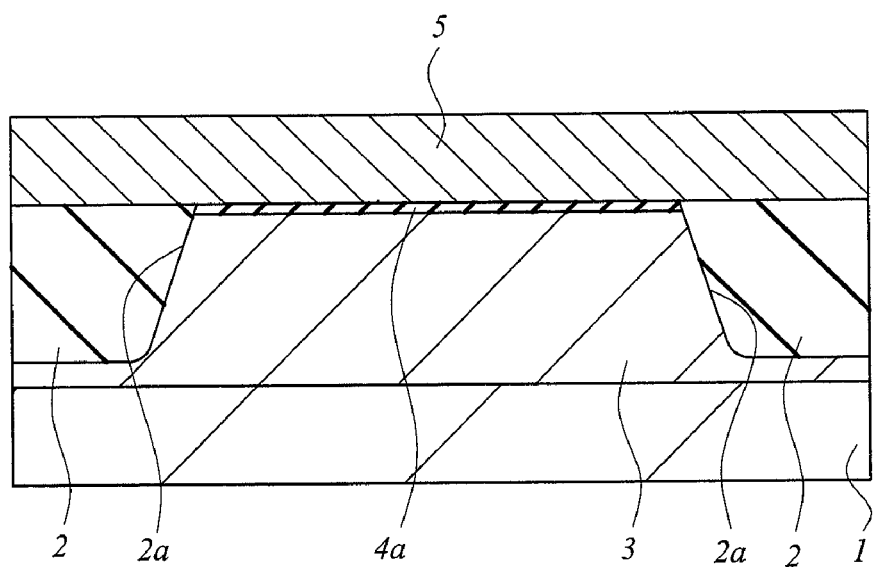
FIG. 2 is a sectional view of the main part during a manufacturing step of the semiconductor device following the step shown in FIG. 1.

First, as shown in FIG. 2, a polysilicon film (a silicon film, a doped polycrystalline silicon film) 5 which is a conductor film for gate electrode formation is formed on the semiconductor substrate 1, namely, on the insulating film 4a, for example, by a CVD (chemical vapor deposition) method or the like. It is preferable that the polycrystalline silicon film 5 is a polycrystalline silicon film doped (introduced) with an n-type impurity such as phosphorous (P). The n-type impurity can be introduced in the polycrystalline silicon film 5, for example, after formation of the polycrystalline silicon film 5 by ion-implantation or the like, but it may be introduced during formation of the polycrystalline silicon film 5 by adjusting film-formation gas for the polycrystalline silicon film 5. It is possible to use an amorphous silicon film instead of the polycrystalline silicon film 5. In this case, a formed amorphous silicon film can be changed to a polycrystalline silicon film according to various high-temperature processes (for example, an activation annealing process for ion-implanted impurity or the like) performed thereafter.

Figure 3:
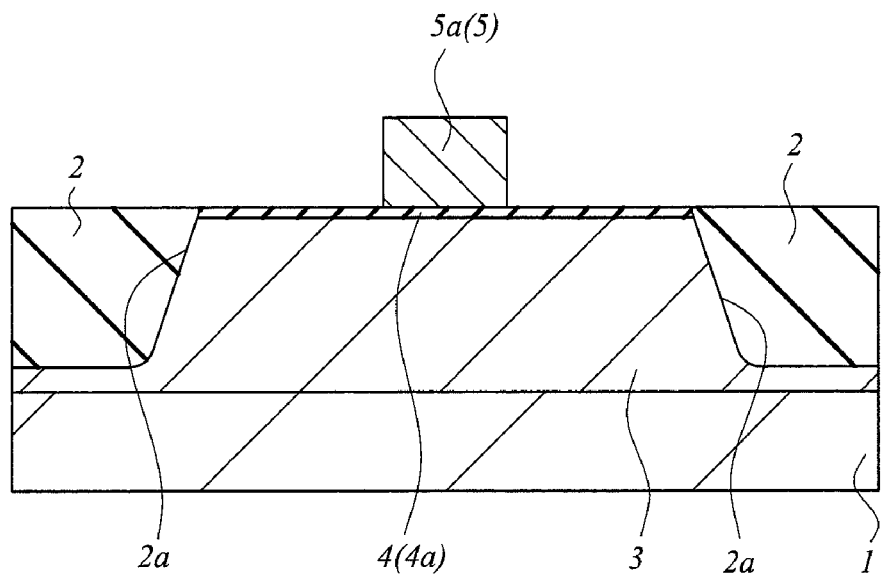
FIG. 3 is a sectional view of the main part of the semiconductor device during a manufacturing step following the step shown in FIG. 2.

As shown in FIG. 3, a gate electrode 5a made of a patterned polycrystalline silicon film 5 is then formed on a surface of the p-type well 3 via the insulating film 4a by patterning the polycrystalline silicon film 5 using a photolithography technology and a dry-etching technique. The insulating film 4a below the gate electrode 5a serves as a gate insulating film 4 of a MISFET. A formation step of the gate electrode 5a will be explained later in detail.

Figure 4:
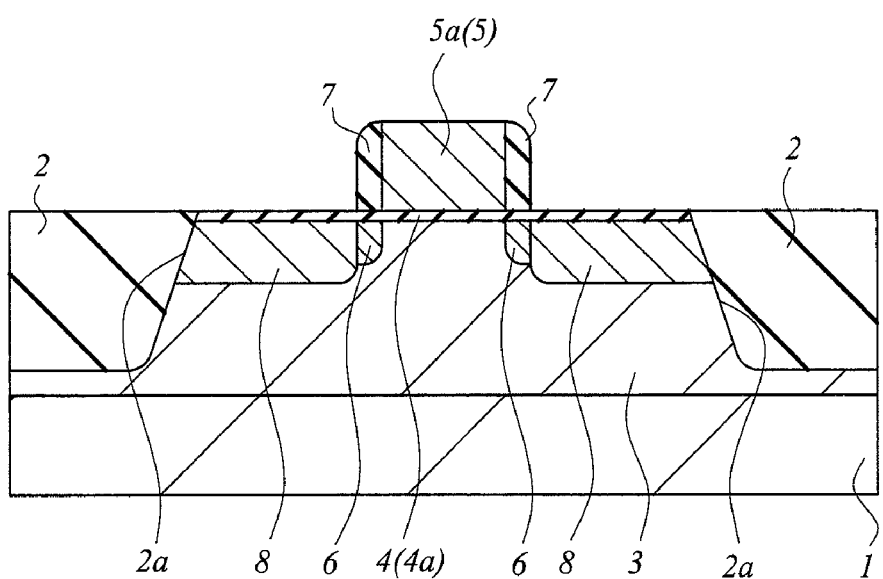
FIG. 4 is a sectional view of the main part during a manufacturing step of the semiconductor device following the step shown in FIG. 3

Next, as shown in FIG. 4, (a pair of) $n^-$-type semiconductor regions 6 are formed by ion-implanting n-type impurity such as phosphorous (P) or arsenic (As) in regions positioned on both sides of the gate electrode 5a of the p-type well 3.

Next, sidewall spacers or sidewalls 7 made from, for example, silicon oxide, a silicon nitride or stacked film of these materials are formed on sidewalls of the gate electrode 5a. Each sidewall 7 can be formed by depositing a silicon oxide film (or a silicon nitride film or a stacked film of these films) on the semiconductor substrate 1 and applying anisotropic etching to the silicon oxide film (or the silicon nitride film or the stacked film of these films).

After formation of the sidewalls 7, (a pair of) $n^+$-type semiconductor regions 8 (source and drain) are formed, for example, by ion-implanting n-type impurity such as phosphorous (P) or arsenic (As) in regions positioned on both sides of the gate electrode 5a and the sidewalls 7 of the p-type well 3. After ion-implantation, annealing process (heat treatment) for activating introduced impurity may also be performed. Each $n^+$-type semiconductor region 8 is higher in impurity concentration than the $n^-$-type semiconductor region 6. Thereby, n-type semiconductor regions (impurity diffusion layers) serving as a source or a drain of the n-channel MISFET are formed by the $n^+$-type semiconductor regions 8 and the $n^-$-type semiconductor regions 6.

Figure 5:
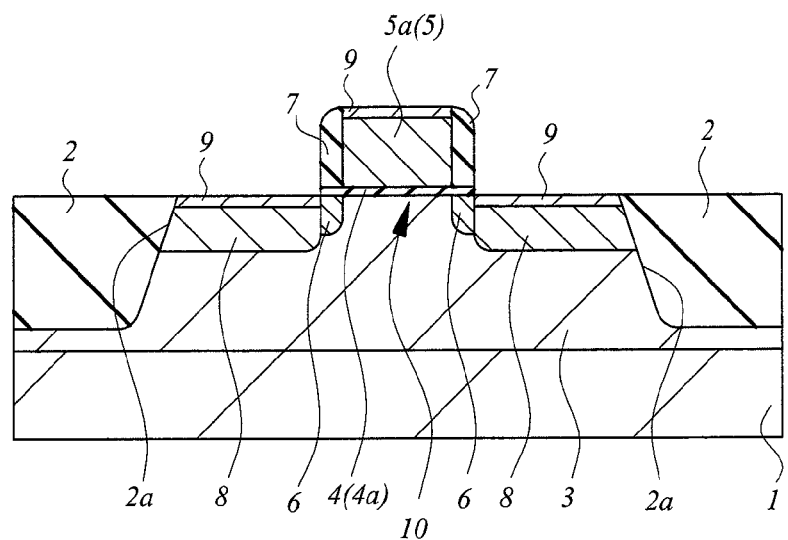
FIG. 5 is a sectional view of the main part during a manufacturing step of the semiconductor device following the step shown in FIG. 4.

Next, as shown in FIG. 5, metal silicide films (for example, cobalt silicide ($CoSi_2$) films) 9 are respectively formed on surfaces of the gate electrode 5a and the $n^+$-type semiconductor region 8 by exposing the surfaces of the gate electrode 5a and $n^+$-type semiconductor region 8 and depositing, for example, cobalt (Co) films thereon to perform heat treatment thereof. Thereby, a diffusion resistance and a contact resistance in the $n^+$-type semiconductor region 8 and the like can be lowered. Thereafter, an unreacted cobalt film is removed. FIG. 5 shows a state that the unreacted cobalt film is removed.

In this manner, an n-channel type MISFET (metal insulator semiconductor field effect transistor) 10 is formed on the p-type well 3. A p-channel type MISFET can also be formed by reversing the conductive type between n-type and p-type.

Figure 6:
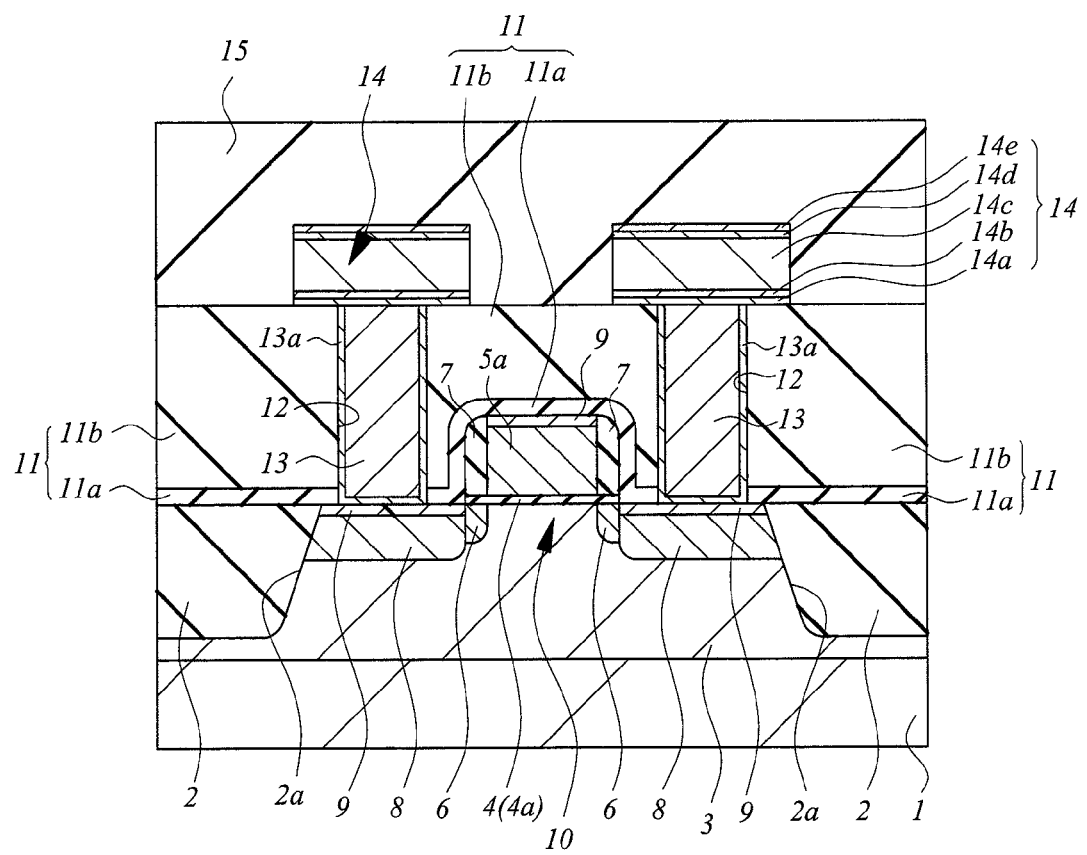
FIG. 6 is a sectional view of the main part during a manufacturing step of the semiconductor device following the step shown in FIG. 5.

Next, as shown in FIG. 6, an insulating film (an interlayer insulating film) 11 is formed on the semiconductor substrate 1 so as to cover the gate electrode 5a, for example, by a CVD process. After formation of the insulating film 11, a surface of the insulating film 11 is planarized as necessary by performing a CMP (chemical mechanical polishing) processing or the like. The insulating film 11 is composed of, for example, a relatively thin silicon nitride film 11a and a relatively thick silicon oxide film 11b thereon, and the silicon nitride film 11a which is a lower layer functions as an etching stopper film at a formation time of a contact hole 12 described later. A single film such as a silicon oxide film may be used as the insulating film 11.

Next, contact holes (opening portions) 12 are formed on an upper portion of the $n^+$-type semiconductor region (a source, a drain) 8 and the like by performing dry etching using a photolithography process on the insulating film 11 using a photoresist pattern (not shown) formed on the insulating film 11 as an etching mask. A portion of the principal surface of the semiconductor substrate 1, for example, a portion of (the silicide film 9 on a surface of) the $n^+$-type semiconductor region 8 or a portion of (the silicide film 9 of a surface of) the gate electrode 5a is exposed at a bottom portion of each contact hole 12.

Next, a plug 13 made from tungsten (W) or the like is formed in the contact hole 12. For example, the plug 13 can be formed by forming a barrier film (for example, titanium nitride film) 13a on the insulating film 11 including the inside of the contact hole 12, then forming a tungsten film on the barrier film 13a so as to fill the contact hole 12 by a CVD process or the like, and removing unnecessary tungsten film and barrier film 13a on the insulating film 11 by a CMP process, an etch-back process, or the like.

Next, an interconnect (a first interconnect layer) 14 is formed on the insulating film 11 having the plug 13 embedded. For example, the interconnect 44 can be formed by forming a titanium film 14a, a titanium nitride film 14b, an aluminum film 14c, a titanium film 14d, and a titanium nitride film 14e in this order by a sputtering process or the like and patterning these films using a lithography process, a dry-etching process and the like. The aluminum film 14c is aluminum (Al) alone or a conductor film containing aluminum as a main component such as aluminum alloy. The interconnect 14 is electrically connected to the $n^+$-type semiconductor region 8 for a source or a drain and the gate electrode 5a and the like of the n-channel type MISFET 10 via the plug 13. The interconnect 14 is not limited to an aluminum interconnect as described above and it may be variously modified. For example, the interconnect 14 may be a tungsten interconnect or a copper interconnect (for example, an embedded copper interconnect formed by a damascene process), for example. Thereafter, an interlayer insulating layer, an upper layer interconnect layer, and the like are further formed, explanation thereof is omitted here. A second layer interconnect and layers subsequent thereto may be embedded copper interconnects formed by a damascene process.

Figure 7:
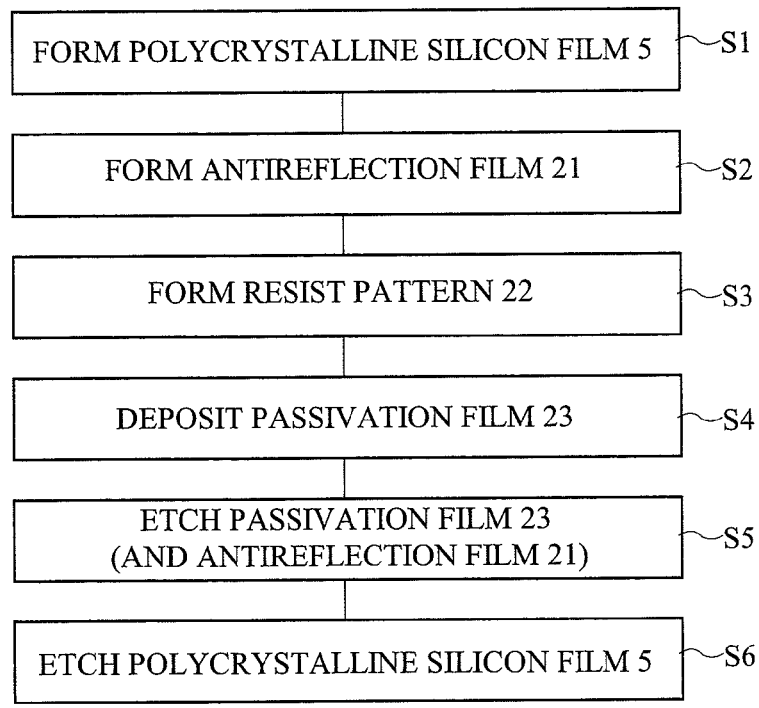
FIG. 7 is a process flowchart of a gate electrode forming step according to a first embodiment of the present invention.
Figure 8A:
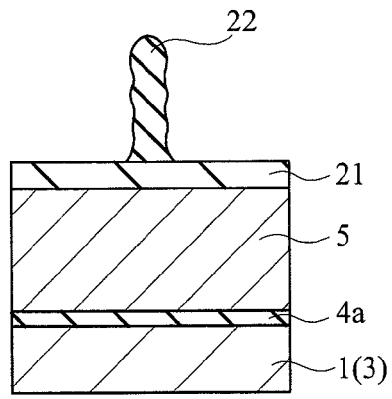
FIG. 8 shows sectional views of a main part and a plan view thereof during the gate electrode forming step according to the first embodiment of the present invention.
Figure 8B:
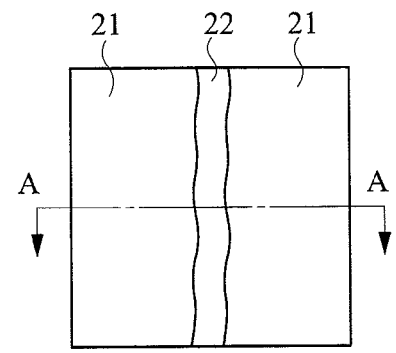
Figure 9A:
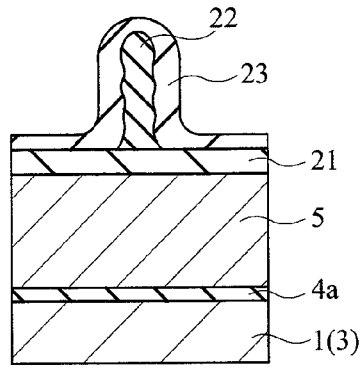
FIG. 9 shows sectional views of a main part and a plan view thereof during the gate electrode forming step following to the step shown in FIG. 8.
Figure 9B:
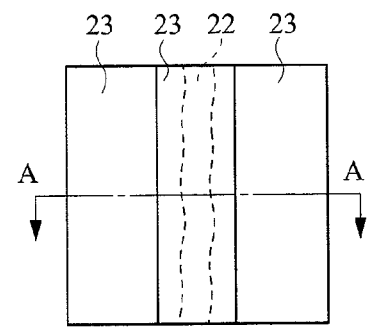
Figure 10A:
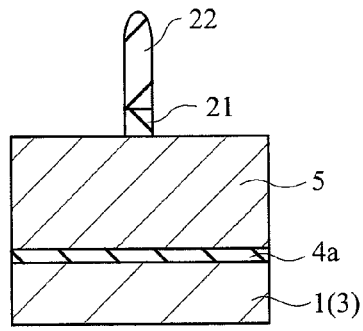
FIG. 10 shows sectional views of the main part and a plan view thereof during a gate electrode forming step following the step shown in FIG. 9.
Figure 10B:
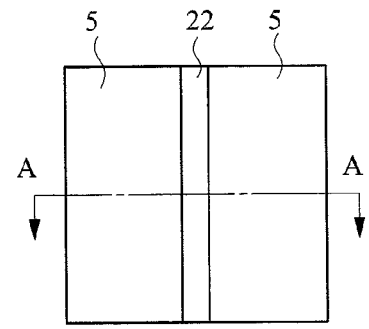
Figure 11A:
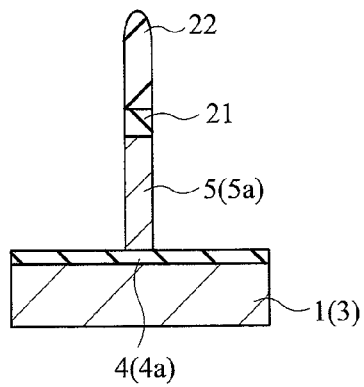
FIG. 11 shows sectional views of the main part and a plan view thereof during a gate electrode forming step following the step shown in FIG. 10.
Figure 11B:
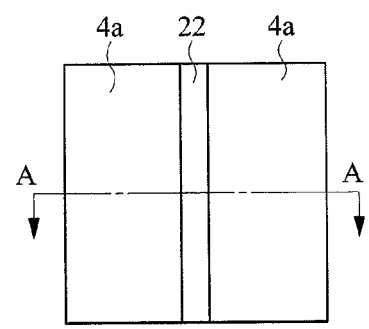

Next, a formation step of the gate electrode 5a in a manufacturing process of a semiconductor device according to the present embodiment will be explained in detail. FIG. 7 is a process flowchart (an explanatory diagram) of a formation step of the gate electrode 5a. FIG. 8 to FIG. 11 are sectional views of a main part and plan views of the main part (top views of the main part) during a manufacturing process of a semiconductor device of the present embodiment, and are sectional views of a main part of a region near a gate electrode during a gate electrode 5a formation (process) step and plan views (top views) of the main part thereof. Among FIG. 8 to FIG. 11, A's thereof correspond to sectional views, and B's thereof correspond to plan views (top views). A sectional view taken along the line A-A in FIG. 8B corresponds to FIG. 8A, a sectional view taken along the line A-A in FIG. 9B corresponds to FIG. 9A, a sectional view taken along the line A-A in FIG. 10B corresponds to FIG. 10A, and a sectional view taken along the line A-A in FIG. 11B corresponds to FIG. 11A.

In order to form the gate electrode 5a, a polycrystalline silicon film 5 is first formed on a semiconductor substrate 1 (a p-type well 3) via an insulating film 4a for gate insulating film as described above (step S1), and an organic antireflection film 21 is formed on the polycrystalline silicon film 5 as shown in FIG. 8 (step S2). The antireflection film 21 is formed for suppressing formation of an abnormal pattern due to reflection and interference of laser for exposure and it is made from organic material (organic insulating film) containing carbon. After that, a resist pattern (a photoresist pattern) 22 is formed by forming a photoresist layer on the antireflection film 21, exposing the photoresist layer (where exposure using ArF excimer laser with a light source wavelength of 193 nm is performed), and developing the same, namely, using a lithography (photolithography) technique (step S3). The resist pattern 22 is a resist pattern corresponding to ArF lithography (a lithography technique performing exposure using ArF excimer laser).

Such a film structure is processed by performing a step of depositing (forming) a passivation film 23 (step S4), a step of etching the passivation film 23 (and the antireflection film 21) (step S5), and a step of etching the polycrystalline silicon film 5 (step S6), so that the gate electrode 5a is formed. For example, an UHF-ECR etching apparatus (a gate etching apparatus) can be used for semiconductor manufacturing for performing steps S4 to S6. Steps S4 to S6 will be explained below in detail.

After the resist pattern 22 is formed at step S3, as shown in FIG. 9, the passivation film 23 is deposited (formed) on the antireflection film 21 so as to cover the resist pattern 22. The passivation film 23 contains carbon and it is formed by plasma using a gas containing fluorocarbon based gas (for example, $CHF_3$ gas) at step S4. For example, the deposition step of the passivation film 23 at step S4 can be performed using the UHF-ECR etching apparatus, for example, under the following condition $A_1$.

Condition $A_1$: UHF power=800 W, wafer bias (bias power or bias voltage applied to a semiconductor substrate (a semiconductor wafer) 1)=10 W, $CHF_3$ gas flow rate=50 sccm.

According to the step S4, as shown in FIG. 9, a uniform passivation film 23 can be formed so as to cover the resist pattern 22. In the present embodiment, the deposition step of the passivation film 23 at step S4 is performed while applying a bias voltage to the semiconductor substrate 1 (wafer).

Figure 14A:
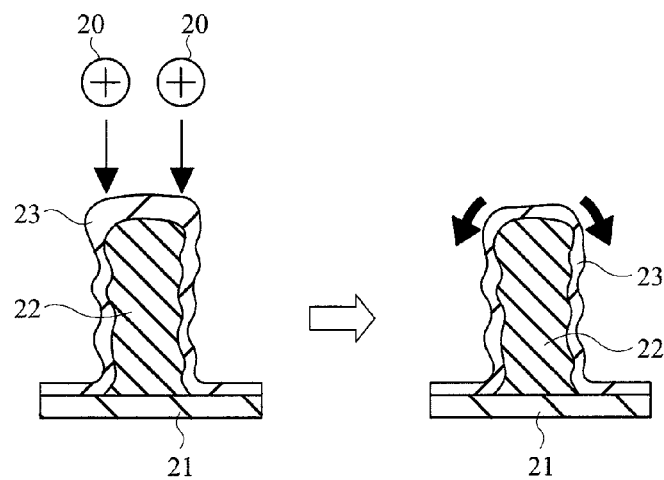
FIG. 14 shows explanatory views for explaining a case where the bias voltage is applied to the semiconductor substrate (a wafer) at the deposition step of the passivation film.
Figure 14B:
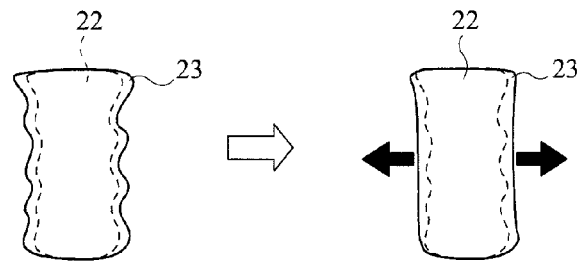

FIG. 12 shows explanatory diagrams where no bias voltage is applied to the semiconductor substrate 1 (wafer) at the deposition step of the passivation film 23 at step S4, and FIG. 13 and FIG. 14 are explanatory diagrams where a bias voltage is applied to the semiconductor substrate 1 (wafer) at the deposition step of the passivation film 23 at step S4 like the present embodiment. A conceptual sectional view of a main part is shown in FIG. 12A and a conceptual plan view of the main part is shown in FIG. 12B. A conceptual sectional view of a main part is shown in FIG. 13. A conceptual sectional view of a main part is shown in FIG. 14A, and a conceptual plan view of a main part is shown in FIG. 12B.

At step S4, when no bias voltage is applied to the semiconductor substrate 1, as shown in FIG. 12, the passivation film 23 is deposited in a shape reflecting a shape of the resist pattern 22, so that a shape reflecting the line edge roughness of the resist pattern 22 appears on a surface of the passivation film 23 and the line edge roughness is hardly reduced. However, when a bias voltage is applied to the semiconductor substrate 1 at step S4 like the present embodiment, high energy ions are incident on the semiconductor substrate 1 so that it is made possible to reduce the line edge roughness owing to the following two actions (a first action and a second action).

The first action (effect) is a selective etching of convexities of the line edge roughness due to incident ions. This is a mechanism where the convexities on a pattern sidewall are selectively etched since they are directly exposed to ions 20 entering from plasma, as shown in FIG. 13. Thereby, roughness of the resist pattern perpendicular to the semiconductor substrate (roughness of a surface of the passivation film 23 covering the resist pattern 22) is reduced.

The second action (effect) is, as shown in FIG. 14, a mechanism where the passivation film 23 deposited on an upper portion of the resist pattern 22 is heated by ions 20 to be increased in fluidity so that concaves of the line edge roughness is filled. Particularly, the line edge roughness of the resist pattern 22 on which the passivation film 23 is deposited (namely, roughness of a surface of the passivation film 23 covering the resist pattern 22) is reduced especially according to mechanism of the second action.

Thus, in the present embodiment, by performing the deposition step of the passivation film 23 at step S4 while applying a bias voltage to the semiconductor substrate 1, a shape reflecting the roughness of the resist pattern 22 is hard to appear on a surface of the passivation film 23, and the line edge roughness of the surface of the passivation film 23 covering the resist pattern 22 at a deposition time of the passivation film 23 can be reduced as compared with the line edge roughness of the resist pattern 22 itself at a formation time of the resist pattern 22, so that the line edge roughness of the pattern including the resist pattern 22 and the passivation film 23 on the surface of the resist pattern 22 can be reduced.

Further, fluorocarbon based gas (namely, $C_xH_yF_z$ gas) is used as a gas (process gas) used at the deposition step of the passivation film 23 at step S4, preferably $C_xH_yF_z$ (x=1 to 10, y=0 to 10, and z=1 to 10), more preferably $CH_2F_2$ gas or $CHF_3$ gas, and most preferably $CHF_3$ gas. When a ratio of carbon (C) element or hydrogen (H) element is excessively high in $C_xH_yF_z$ gas, deposition easiness becomes excessively high, and possibility of ununiform deposition of the passivation film 23 becomes high. However, by depositing the passivation film 23 using more preferably $CH_2F_2$ gas or $CHF_3$ gas, most preferably $CHF_3$ gas, it is made possible to deposit the passivation film 23 more uniformly.

Further more, at step S4, a pressure in a process chamber (chamber) in which the semiconductor substrate 1 (wafer) is installed is preferably 3 Pa or less, more preferably 0.5 Pa or less. When the pressure is more than 3 Pa, possibility of ununiform deposition of the passivation film 23 becomes high. However, by performing the deposition step of the passivation film 23 at step S4 at pressure of preferably 3 Pa or less, more preferably 0.5 Pa or less, it is made possible to deposit the passivation film 23 more uniformly. In the present embodiment, for example, deposition of the passivation film 23 at step S4 is performed at pressure of 0.2 Pa.

After the passivation film 23 is deposited at step S4, the passivation film 23 is etched (removed) at step S5. At the etching step of the passivation film 23 at step S5, a gas containing $O_2$ (oxygen) gas is used, for example, mixed gas of Ar gas, HBr gas, and $O_2$ gas is used. The gas is made to be plasma to etch the passivation film 23 (plasma etching, dry etching). That is, the passivation film 23 is etched by plasma using a gas containing oxygen gas. For example, by using the UHF-ECR etching apparatus, the etching step of the passivation film 23 at step S5 can be performed, for example, under the following condition $B_1$.

Condition $B_1$: UHF power=900 W, wafer bias (bias power or bias voltage applied to the semiconductor substrate 1)=10 W, flow rate of Ar gas=200 sccm, flow rate of HBr gas=60 sccm, and flow rate of $O_2$ gas=30 sccm.

In the present embodiment, since the organic antireflection film is used as the antireflection film 21, the antireflection film 21 may also be etched (removed) at the etching step of the passivation film 23 at step S5 performed by plasma using a gas containing oxygen gas. Accordingly, as shown in FIG. 10, the carbon-containing passivation film 23 and the organic antireflection film 21 can be etched at step S5. Since the resist pattern 22 can function as an etching mask for the antireflection film 21 at step S5, the antireflection film 21 below the resist pattern 22 remains, and the antireflection film 21 positioned on a region where it is not covered with the resist pattern 22 is selectively etched and removed.

Further, in the present embodiment, the etching step of the passivation film 23 (and the antireflection film 21) at step S5 is performed while a bias voltage (wafer bias) is applied to the semiconductor substrate 1 (wafer). Therefore, since convexities on the line edge roughness on the surface of the passivation film 23 covering the resist pattern 22 are selectively etched by incident ions at step S5 like the first action, the line edge roughness (the roughness of the surface of the passivation film 23 covering the resist pattern 22) is reduced according to advance of etching of the passivation film 23. Accordingly, the line edge roughness after the etching step of the passivation film 23 at step S5 can further be reduced as compared with the line edge roughness just after the deposition of the passivation film 23 at step S4 (the roughness of the surface of the passivation film 23 covering the resist pattern 22).

Since oxygen ($O_2$) gas is contained in the process gas at step S5, when the passivation film 23 is removed so that the resist pattern 22 is exposed, the resist pattern 22 may also be etched. Thereby, the resist pattern 22 is formed in a thin line. At this time, since the convexities of the line edge roughness is selectively etched by incident ions according to the first action, the line edge roughness on the resist pattern 22 can further be reduced.

In the present embodiment, the etching where the deposition step (step S4) and the removal step (step S5) of the passivation film 23 are performed separately has been explained as an example, but even if the deposition step and the removal step of the passivation film 23 are alternately performed multiple times, an effect of line edge roughness reduction can be obtained similarly. In this case, the condition $B_1$ at step S5 is a condition for etching the passivation film 23 and the resist pattern 22, and since an etching selection ratio between the passivation film 23 and the polycrystalline silicon film 5 is sufficiently high, etching of the polycrystalline silicon film 5 is prevented from progressing. Japanese Patent Application Laid-Open Publication No. 11-195641 (the Patent Document 4) describes a technique for etching silicon at a high rate while protecting silicon oxide serving as a mask by alternately performing a deposition step using $C_4F_8$ and an etching step using $SF_6$. Thus, the technique described in Japanese Patent Application Laid-Open Publication No. 11-195641 is a technique for alternately performing a deposition step using $C_4F_8$ and an etching step using $SF_6$ when etching silicon below the silicon oxide mask, which is essentially different from the present embodiment where the deposition step and the removal step of the passivation film 23 are alternately performed multiple times without etching the polycrystalline silicon film 5 below the resist pattern 22 and the antireflection film 21 so that the line edge roughness of the resist pattern 22 is reduced, therefore a reduction effect of the line edge roughness can not be obtained in the technique described in Japanese Patent Application Laid-Open Publication No. 11-195641. In the present embodiment, an effect of reducing the line edge roughness can be obtained by the step of depositing the passivation film 23 on the resist pattern 22 and the step of removing the same, but an effect of further reducing the line edge roughness can be obtained by alternately performing the deposition step of the passivation film 23 and the removal step thereof multiple times.

Furthermore, at step S5, a pressure in the process chamber (chamber) in which the semiconductor substrate 1 is installed is preferably 2 Pa or more, more preferably 10 Pa or more. When the pressure is smaller than 2 Pa, a difference in etching rate tends to occur between a sparse pattern and a dense pattern. However, by performing the etching step of the passivation film 23 and the antireflection film 21 at step S5 at a pressure of preferably 2 Pa or more, more preferably 10 Pa or more, a difference in etching rate can be prevented from occurring between the sparse pattern and the dense pattern, so that the etching of the passivation film 23 and the antireflection film 21 can be performed at a more uniform etching rate within in-plane of the semiconductor substrate 1. In the present embodiment, the etching of the passivation film 23 and the antireflection film 21 at step S5 can be performed, for example, at a pressure of 10 Pa.

After the passivation film 23 and the antireflection film 21 are etched at step S5, as shown in FIG. 11, the polycrystalline silicon film 5 is etched (removed) using the resist pattern 22 with reduced line edge roughness as an etching mask at step S6.

At the etching step of the polycrystalline silicon film 5 at step S6, mixed gas of $Cl_2$ (chlorine) gas, HBr gas, and $O_2$ (oxygen) gas is used. The gas is made into plasma to etch the polycrystalline silicon film 5. That is, the polycrystalline silicon film 5 is plasma-etched (dry-etched). For example, the etching step of the polycrystalline silicon film 5 at step S6 can be performed using the UHF-ECR etching apparatus, for example, under the following condition $C_1$.

Condition $C_1$: UHF power=500 W, wafer bias (bias power or bias voltage applied to the semiconductor substrate 1)=15 W, flow rate of $Cl_2$ gas=20 sccm, flow rate of HBr gas=80 sccm, and flow rate of $O_2$ gas=5 sccm According to an etching step of the polycrystalline silicon film 5 at step S6 is performed using the resist pattern 22 with the line edge roughness reduced at step S4 and step S5 as an etching mask so that the polycrystalline silicon film 5 patterned at the etching step at step S6 becomes the gate electrode 5a, the line edge roughness of the gate electrode 5a can be reduced. In the present embodiment, for example, the gate electrode 5a where the line edge roughness is about 2 nm and the amount of change in size is about −10 nm can be formed.

In the present embodiment, the method where fluorocarbon based gas (namely, $C_xH_yF_z$ gas) is used as the gas (process gas) at the step of depositing the passivation film 23 on the resist pattern 22 at step S4 has been explained as the example, but similar effect can be achieved even if a gas having deposition easiness such as, for example, chlorocarbon based gas (namely, $C_xH_yCl_z$ gas), or for example, $CH_4$, $NH_3$, or $NF_3$.

Further, in the present embodiment, the method where the step of depositing the passivation film 23 on the resist pattern 22 at step S4, the step of removing the passivation film 23 at step S5, and the step of etching the polycrystalline silicon film 5 at step S6 are consistently performed in the same etching chamber has been explained as the example, but the effect of the present embodiment can be obtained even if all the steps or some of the steps are performed in different etching chambers, which is included in this embodiment.

Further, in the present embodiment, the method where the step of depositing the passivation film 23 on the resist pattern 22 at step S4 is performed using the etching chamber has been explained as the example, but the first action and the second action are promoted by depositing the passivation film 23, for example, using such a film forming apparatus as a CVD apparatus, a PVD apparatus, or a P-CVD apparatus, thereafter applying a bias voltage to the semiconductor substrate 1 using an etching chamber, and irradiating high energy ions into the semiconductor substrate 1, so that the line edge roughness can be reduced.

Furthermore, in the present embodiment, the step of etching the polycrystalline silicon film 5 at step S6 under the single condition $C_1$ has been explained as the example, but the effect of reducing the line edge roughness is mainly achieved by the step of depositing the passivation film 23 on the resist pattern 22 at step S4 and the step of removing the passivation film 23 at step S5. Therefore, even if the etching is performed in a state that the step of etching the polycrystalline silicon film 5 at step S6 is divided to a plurality of steps, the effect of the present embodiment can be achieved, which can be included in the present invention.

Figure 15:
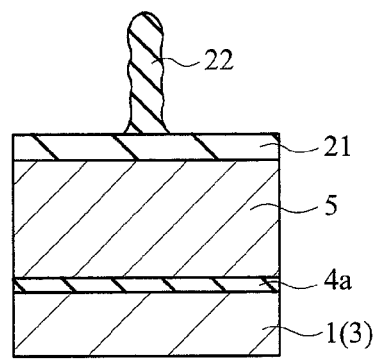
FIG. 15 is a sectional view of a main part during a gate electrode forming step of a first comparative example.
Figure 16:
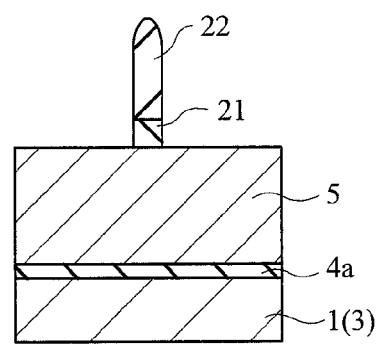
FIG. 16 is a sectional view of the main part during a gate electrode forming step following the step shown in FIG. 15.
Figure 17:
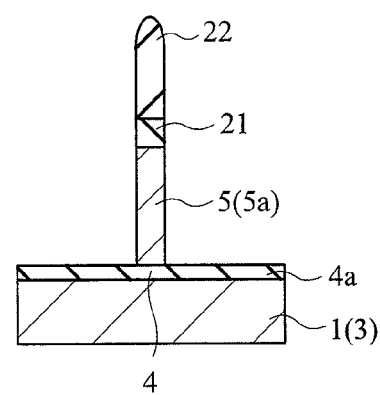
FIG. 17 is a sectional view of the main part during a gate electrode forming step following the step shown in FIG. 16.

It can be considered that the deposition step of the passivation film 23 at step S4 is omitted and fine line formation (reduction in width) of the resist pattern 22 is performed under a condition similar to that at step S5 (a first comparative example), which is different from the present embodiment. FIG. 15 to FIG. 17 are sectional views of a main part during a gate electrode formation step in the first comparative example where the deposition step of the passivation film 23 at step S4 is omitted, which is different from the present embodiment. In the first comparative example, as shown in FIG. 15, after the resist pattern 22 is formed, the antireflection film 21 is etched without forming the passivation film 23, as shown in FIG. 16. Thereafter, the polycrystalline silicon film 5 is dry-etched to form the gate electrode 5a using the photoresist pattern 22 as the etching mask.

In the first comparative example, after the resist pattern 22 is formed, the antireflection film 21 is etched under a condition approximately similar to that at step S5 without forming the passivation film 23, but since dry-etching using plasma containing oxygen as the process gas is performed at the etching step of the antireflection film 21, the organic antireflection film 21 is etched and the resist pattern 22 made from organic material is also etched so that a film thickness of the resist pattern 22 is reduced and the resist pattern 22 is formed in a thin line (that is, a width $L_1$ of the resist pattern 22 is made thin).

FIG. 18 shows explanatory diagrams illustratively showing an aspect where after the resist pattern 22 is formed, the antireflection film 21 is etched and the resist pattern 22 is also etched to form a thin line in the first comparative example. A state that the resist pattern 22 is formed is shown on the left sides in the FIG. 18, and a state that the antireflection film 21 is etched and the resist pattern 22 is also etched to form a thin line is shown on the right sides in FIG. 18. A conceptual sectional view of a main part is shown in FIG. 18A, and a conceptual plan view of a main part is shown in FIG. 18B. FIG. 19 is a graph showing a relationship between the amount of change ΔL (here, $ΔL=L_1-L_0$) from an initial size $L_0$ of the resist pattern 22 and the line edge roughness of the resist pattern 22 in the first comparative example.

In the first comparative example, as shown in FIG. 18 and FIG. 19, since etching of line edge roughness convexities of the resist pattern 22 progresses according to isotropic etching due to oxygen radical at the etching step of the antireflection film 21, the line edge roughness of the resist pattern 22 can be reduced along with thinning of the resist pattern 22 to a thin line (reduction of the width $L_1$). For example, as shown in FIG. 19, by thinning the resist pattern 22 into a thin line by an amount of about 50 nm or more (namely, reducing the wide $L_1$ of the resist pattern 22 from its initial size $L_0$ by an amount of 50 nm or more), the line edge roughness of the resist pattern 22 can be reduced to 3 nm or less. However, since the film thickness of the resist pattern 22 is reduced according to thinning of the resist pattern 22 into a thin line, when the resist pattern 22 is formed in an excessively thin line, the film thickness of the resist pattern 22 is also thinned so that such a possibility arises that the remaining film thickness of the resist pattern 22 becomes insufficient for etching the polycrystalline silicon film 5 at step S6 performed thereafter. The insufficient film thickness may cause lowering of a process precision for the gate electrode 5a to be formed, which may result in lowering of a manufacture yield of a semiconductor device. In addition, when the remaining film thickness of the resist pattern 22 is secured to a certain extent for precisely performing etching of the polycrystalline silicon film 5, thinning (reduction of the width $L_1$) of the resist pattern 22 must be suppressed, therefore the line edge roughness of the resist pattern 22 can not be reduced. Therefore, in the first comparative example where the line edge roughness is reduced using formation of the resist pattern into a thin line, it is difficult to control the reduction amount of the line edge roughness and the resist pattern size independently, and it is very difficult to process (form) a gate electrode with a small line edge roughness, for example, a gate electrode with line edge roughness of about 3 nm or less.

FIG. 20 shows explanatory diagrams illustratively showing an aspect where after the resist pattern 22 is formed at step S3, the deposition step of the passivation film 23 at step S4 is performed like the present embodiment and then the resist pattern is thinned to a thin line by etching the passivation film 23 and the antireflection film 21 at step S5. A state that the resist pattern is formed at step S3 is shown on the left sides in FIG. 20, a state that deposition of the passivation film 23 is performed at step S4 is shown in the centers in FIG. 20, and a state that etching of the passivation film 23 and the antireflection film 21 is performed at step S5 is shown on the right sides in FIG. 20. A conceptual sectional view of a main part is shown in FIG. 20A, and a conceptual plan view of a main part is shown in FIG. 20B. FIG. 21 is a graph showing a relationship between the amount of change $\Delta L$ (here, $\Delta L = L_i - L_0$: i=2, 3) from an initial size $L_0$ of the resist pattern 22 and the line edge roughness of the resist pattern 22 in the present embodiment.

Note that, in the present embodiment, when the passivation film 23 is not formed on the surface of the resist pattern 22, the size (width) $L_i$ of the resist pattern corresponds to a size (a width) of the resist pattern 22 itself, and when the passivation film 23 is formed on the surface of the resist pattern 22, the size $L_1$ corresponds to a size (a width) of a pattern of the resist pattern 22 combined with the passivation film 23 since the passivation film 23 may also function as an etching mask like the resist pattern 22.

When both step S4 and step S5 are used like the present embodiment, as shown in FIG. 20 and FIG. 21, the size $L_2$ (the size $L_2$ of a pattern of the resist pattern 22 combined with the passivation film 23) of the resist pattern becomes thick by an amount corresponding to the passivation film 23 at a time when the passivation film 23 is deposited at step S4, but the line edge roughness can be reduced according to the above described first and second actions. By further etching the passivation film 23 at step S5, thinning from the size $L_1$ just after the passivation film 23 is deposited to the size $L_3$ can be performed and the line edge roughness can further be reduced as compared with the case that only step S4 is performed (namely, the case where step S5 is not performed).

The feature of the present embodiment lies in that the amount of change in size $\Delta L$ of the resist pattern and the reduction amount of the line edge roughness can be controlled independently according to (the condition $A_1$ of) step S4 of depositing the passivation film 23 and (the condition $B_1$ of) step S5 of etching the passivation film 23 and the antireflection film 21. For example, by optimizing (the condition $A_1$ of) step S4 and (the condition $B_1$) of step S5, it is made possible to reduce only the line edge roughness without changing the size from the initial resist pattern. That is, even when the resist pattern size $L_3$ after the etching step of the passivation film 23 at step S5 is made equal to the initial size $L_0$ (a case of $L_3=L_0$, namely, a case of $\Delta L=0$), the line edge roughness can be reduced as compared with the line edge roughness just after the resist pattern 22 has been formed at step S3. Even when the resist pattern size $L_3$ after the etching step of the passivation film 23 at step S5 is made thinner than the initial size $L_0$ (a case of $L_3 < L_0$, namely, a case of $\Delta L < 0$), the line edge roughness can further be reduced as compared with the first comparative example.

Japanese Patent Application Laid-Open Publication No. 10-4084 (Patent Document 3) describes a technique of forming a resist pattern on a metallic film on a substrate at a first step, forming a passivation film on a surface of the resist pattern according to plasma process using fluorocarbon gas at a second step, and thereafter etching the metallic film using a photoresist pattern formed with the passivation film as an etching mask at a third step, where the metallic film is etched using the photoresist pattern formed with the passivation film as the etching mask at the third step while the passivation film is completely left without performing an etching step to the passivation film formed on the surface of the resist pattern. Thus, in the technique described in Japanese Patent Application Laid-Open Publication No. 10-4084, since the metallic film which is the film to be processed is etched without performing the etching step to the passivation film in a state that the passivation film has been deposited on the resist pattern, etching of the metallic film which is the film to be processed is performed in a state that the line edge roughness of the resist pattern formed with the passivation film is relatively large so that the line edge roughness of the metallic film which has been processed becomes relatively large.

On the other hand, in the present embodiment, the passivation film 23 is deposited on the antireflection film 21 so as to cover the resist pattern 22 at step S4, the passivation film 23 is positively etched at step S5, and the polycrystalline silicon film 5 which is the film to be processed is etched using the photoresist pattern 22 as the etching mask at step S6. As also shown in FIG. 20 and FIG. 21, by performing the etching step of the passivation film 23 at step S5, the line edge roughness of the photoresist pattern 22 after the etching step of the passivation film 23 at step S5 can further be reduced as compared with the line edge roughness of the surface of the passivation film 23 just after deposition of the passivation film 23 at step S4, and the polycrystalline silicon film 5 which is a layer to be processed of a base can be etched using the photoresist pattern 22 with the further reduced line edge roughness as the etching mask at step S6. Therefore, the line edge roughness of the processed polycrystalline silicon film 5, namely, the gate electrode 5a can further be reduced.

Thus, in the present embodiment, the process size is thickened by once depositing the passivation film 23 so as to cover the resist pattern 22 and the size of the resist pattern 22 is then thinned while removing the passivation film 23. In the present embodiment, therefore, it is possible to control a size of a portion which is not removed by etching like a gate electrode process thinly. Further, in the present embodiment, the size change amount of the resist pattern can be controlled at the deposition step of the passivation film 23 at step S4 and at the removal step of the passivation film at step S5 independently. Since the reduction effect of line edge roughness can be obtained both at the deposition step of the passivation film at step S4 and at the etching step of the passivation film at step S5, a resist pattern with a further reduced line edge roughness can be realized so that line edge roughness of a layer to be processed which has been processed by a dry etching using the resist pattern as the etching mask can further be reduced. Thus, in the present embodiment, the resist pattern process size and the line edge roughness reduction amount can be controlled independently of each other.

In the present embodiment, even if line edge roughness occurs in the resist pattern 22 formed at step S3, the line edge roughness is reduced by depositing the passivation film 23 containing carbon so as to cover the resist pattern 22 using fluorocarbon gas as the process gas at step S4, the line edge roughness can further be reduced by removing at least one portion of the passivation film 23 by etching at step S5, and the remaining resist film can be sufficiently secured by controlling the deposition amount of the passivation film 23 at step S4 and the thin line amount of the resist pattern at step S5, so that the reduction amount of the line edge roughness and the pattern size can be controlled independently of each other.

In the present embodiment, since the line edge roughness of the resist pattern can be reduced, a gate electrode with a reduced line edge roughness can be formed. For example, it is made possible to form a gate electrode with line edge roughness of about 3 nm or less. Since the size of the resist pattern and the reduction amount of the line edge roughness can be controlled independently of each other and the resist remaining amount can be secured sufficiently, it is made possible to control a process size of a gate electrode with reduced line edge roughness (for example, a gate electrode with line edge roughness of 3 nm or less) with high precision. Accordingly, a performance of a semiconductor device can be improved. It is also possible to improve productivity of a semiconductor device and improve manufacture yield thereof.

A resist film (a resist pattern) used in a lithography (ArF lithography) technique using an ArF excimer laser easily causes the line edge roughness as compared with a resist film (a resist pattern) for lithography (KrF lithography) using KrF excimer laser. However, when the present invention is applied to a case that the resist pattern 22 corresponding to an ArF lithography (a resist pattern formed using an ArF lithography) is used like the present embodiment, the line edge roughness can be reduced even in the resist pattern 22 corresponding to the ArF lithography, which is especially effective.

At the etching step of the passivation film 23 at step S5, it is further preferable in view of the reduction effect of the line edge roughness that the whole passivation film 23 is removed by etching. By performing the etching step of the passivation film 23 at step S5 so as to remove the whole passivation film 23, the line edge roughness of the photoresist pattern 22 remaining after the etching step of the passivation film 23 at step S5 can further be reduced, and the etching step of the polycrystalline silicon film 5 at step S6 can be performed while the photoresist pattern 22 with the reduced line edge roughness is caused to function as the etching mask, so that the line edge roughness of the gate electrode 5a composed of the patterned polycrystalline silicon film 5 can further be reduced. Also, since the resist pattern 22 can be formed in a thin line, it is advantageous for miniaturization of the gate electrode 5a. However, even when a portion of the passivation film 23 is removed by etching at step S5 and the etching step of the polycrystalline silicon film 5 at step S6 is performed in a state that another portion of the passivation film 23 is left on the surface of the resist pattern 22, the effect of the present embodiment can be obtained, such a case is included in the present embodiment.

That is, even when a portion of the passivation film 23 is etched and removed and another portion thereof is left at step S5, line edge roughness of a pattern of the resist pattern 22 plus the remaining passivation film 23 can be reduced as compared with that as the deposition time of the passivation film 23 at step S4, and the remaining portion of the passivation film 23 and the resist pattern 22 can function as the etching mask at the etching step of the polycrystalline silicon film 5 at step S6. Accordingly, even when a portion of the passivation film 23 is etched and removed and another portion thereof is left at step S5, an etching mask pattern with reduced line edge roughness (namely, an etching mask composed of the remaining portion of the passivation film 23 and the photoresist pattern 22) can be caused to function as an etching mask to perform the etching step of the polycrystalline silicon film 5 at step S6, so that it is made possible to reduce the line edge roughness of the gate electrode 5a made of the patterned polycrystalline silicon film 5.

Thus, in the present embodiment, by depositing the passivation film 23 so as to cover the resist pattern 22 at step S4 after forming the resist pattern 22 at step S3, the line edge roughness of the pattern of the resist pattern 22 plus the passivation film 23 is reduced (as compared with the line edge roughness of the resist pattern 22 at the formation time of the resist pattern 22 at step S3), and by etching and removing at least one portion of the passivation film 23 at step S5, the line edge roughness of the pattern of the resist pattern 22 plus the passivation film 23 is further reduced. Then, by etching a layer to be processed (here, the polycrystalline silicon film 5) using the resist pattern 22 and the remaining portion of the passivation film 23 as the etching mask at step S6, the line edge roughness of the processed layer to be processed (here, the gate electrode 5a) can be reduced. When the whole passivation film 23 is etched and removed at the etching step of the passivation film 23 at step S5 and a layer to be processed (here, the polycrystalline silicon film 5) is etched using the resist pattern 22 as the etching mask at step S6, the line edge roughness of the processed layer to be processed (here, the gate electrode 5a) can be reduced, which is desirable.

When the line edge roughness of the gate electrode is large, lowering of productivity (lowering of manufacture yield) occurs due to lowering of device performance or variations of device performance, so that it is especially effective to from a gate electrode with reduced line edge roughness by applying the present invention to the formation step of the gate electrode like the present embodiment. However, since the feature of the present invention lies in that the step of depositing (forming) the passivation film so as to cover the resist pattern and removing (etching) the passivation film is provided, the present invention can be principally applied to all dry-etching methods having a step of etching a film to be processed using a resist pattern as an etching mask. Application examples will be explained regarding the following embodiments.

Second Embodiment

In a second embodiment, the gate electrode 5a can be formed in the same manner as the first embodiment, but a temperature and a temperature distribution of a semiconductor substrate 1 are controlled at each step of the steps S4, S5, and S6 in the second embodiment. Since each step of steps S4 to S6 is similar to that in the first embodiment except for the temperature and the temperature distribution of the semiconductor substrate 1, explanation thereof is omitted.

Figure 22:
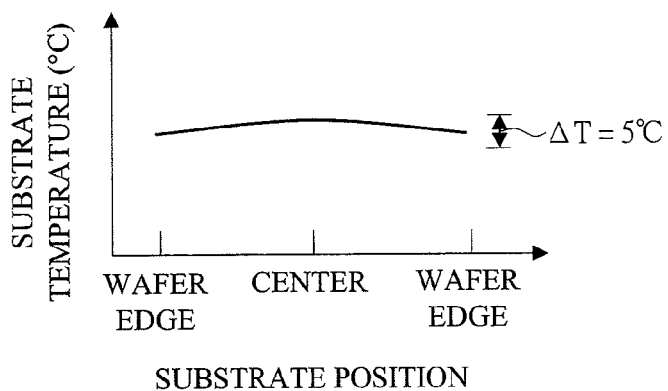
FIG. 22 is a graph showing one example of a temperature distribution of a semiconductor substrate during a manufacturing step of a semiconductor device.
Figure 23:
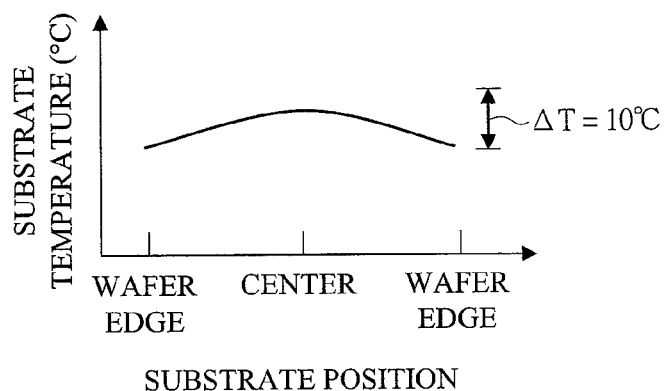
FIG. 23 is a graph showing one example of a temperature distribution of a semiconductor substrate during a manufacturing step of a semiconductor device.
Figure 24:
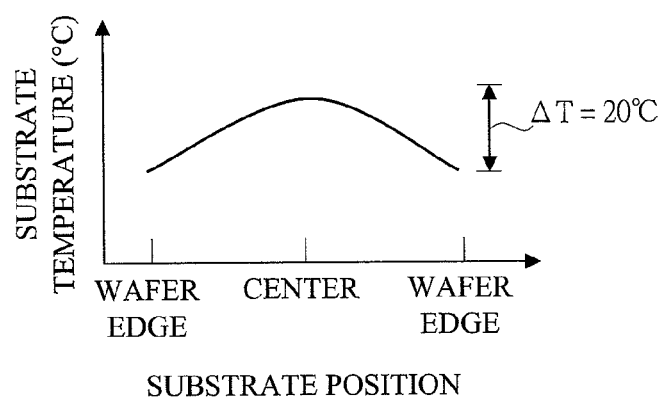
FIG. 24 is a graph showing one example of a temperature distribution of a semiconductor substrate during a manufacturing step of a semiconductor device.

FIG. 22 to FIG. 24 are graphs showing one example of a temperature distribution of the semiconductor substrate 1 during manufacturing step of a semiconductor device of the second embodiment. FIG. 22 corresponds to a temperature distribution of the semiconductor substrate 1 during deposition step of a passivation film 23 at step S4, FIG. 23 corresponds to a temperature distribution of the semiconductor substrate 1 during etching step of the passivation film 23 (and an antireflection film 21) at step S5, and FIG. 24 corresponds to a temperature distribution of the semiconductor substrate 1 during etching step of a polycrystalline silicon film 5 at step S6.

In the present embodiment, as shown in graph of FIG. 22, a temperature difference ΔT (a difference between the maximum temperature and the minimum temperature of a principal face of the semiconductor substrate 1) of in-plane of the semiconductor substrate 1 is controlled to, for example, 5° C. or less, and a passivation film 23 is deposited on an antireflection film 21 so as to cover a resist pattern 11 using, for example, the condition $A_1$ and the like at the deposition step of the passivation film 23 at step S4.

Next, as shown in graph of FIG. 23, the temperature difference ΔT of in-plane of the semiconductor substrate 1 is controlled to, for example, about 10° C. and the passivation film 23 and an organic antireflection film 21 are etched according to the condition $B_1$ or the like at the etching step of the passivation film 3 (and the antireflection film 21) at step S5.

Next, as shown in graph of FIG. 24, the temperature difference ΔT of in-plane of the semiconductor substrate 1 is controlled to, for example, 20° C. or more and a polycrystalline silicon film 5 is etched to process a gate electrode 5a according to the condition $C_1$ or the like at the etching step of the polycrystalline silicon film 5 at step S6.

Thus, for example, a gate electrode 5a with line edge roughness of about 2 nm, a size change amount of about –10 nm, and in-plane evenness of the semiconductor substrate 1 of 1 nm or less can be formed by considering the temperature distribution of the semiconductor substrate 1 too.

The object of controlling the temperature and the temperature distribution of the semiconductor substrate 1 is to solve a problem due to difference in reaction mechanism among respective steps of steps S4 to S6. In general, etching means that ions or radical produced in plasma enter in a semiconductor substrate and silicon (S) or organic material which is material to be processed is processed due to surface reaction of ions or radical with the silicon or organic material. Reaction products occurring at the etching time also enter in the semiconductor substrate again to block etching reaction. The surface reaction and adhesion of the radical or the reaction products largely depend on the temperature of the semiconductor substrate. Therefore, the process size and process shape varies according to not only flux of ions or radical entering in the semiconductor substrate, or reaction products but also the semiconductor substrate temperature. An in-plane distribution of flux of ions or radical entering in the semiconductor substrate can normally be controlled by controlling a distribution of plasma, but since the reaction products basically show a diffusion distribution, it is difficult to control the distribution. Therefore, a method for controlling a process size and a process shape by controlling a temperature distribution of a semiconductor substrate is a method which is considerably effective for improving semiconductor substrate in-plane evenness of a process precision.

Since a reaction where carbon reaction material produced evenly in plasma adheres to a resist pattern 22 is important as a main surface reaction at step S4 for depositing the passivation film 23, it is desirable that the temperature of in-plane of the semiconductor substrate 1 is even.

On the other hand, since complicated reaction between ions, radical entering in the polycrystalline silicon film 5 and Si reaction products, and the polycrystalline silicon film 5 becomes dominant, it is necessary to control a temperature distribution considering a semiconductor substrate in-plane distribution of respective incident particles. For example, since re-adhesion of reaction products tends to becomes larger near a central portion of a principal face of the semiconductor substrate 1 than near an end portion of the principal face of the semiconductor substrate 1, the re-adhesion of reaction products can be made even within a plane of the principal face of the semiconductor substrate 1 by making the temperature of the semiconductor substrate 1 higher near the a central portion of the principal face of the semiconductor substrate 1 than near the end portion of the principal face of the semiconductor substrate 1. Thereby, the etching rate of the polycrystalline silicon film 5 can be made further even within the plane of the main face of the semiconductor substrate 1.

In the present embodiment, therefore, the temperature distribution of the semiconductor substrate 1 is made more even at step S4 than at step S6, so that the temperature difference ΔT within the plane of the principal face of the semiconductor substrate 1 is made smaller. A temperature distribution is caused in the semiconductor substrate 1 at step S6, which is different from step S4, so that a temperature difference ΔT within the plane of the principal face of the semiconductor substrate 1 becomes higher. That is, the temperature distribution of the semiconductor substrate 1 at each step is controlled such that the temperature difference within the plane of the semiconductor substrate 1 at step S4 becomes smaller than those within the plane of the principal face of the semiconductor substrate 1 at step S5 and step S6.

The temperature distributions (in-plane temperature differences) within the plane of the semiconductor substrate shown in FIG. 22 to FIG. 24 are examples, and they are not limited to the examples. It is important to control the temperature and the temperature distribution of the semiconductor substrate 1 for each step of steps S4 to S6. As the method for controlling the temperature and the temperature distribution of the semiconductor substrate 1, there are use of plural coolants at wafer stage on which the semiconductor substrate 1 is disposed, control of back face He pressure, utilization of a heater, and the like.

Thus, in the present embodiment, it is made possible to change balance of etching surface reaction within the wafer plane by controlling the temperature distribution of the semiconductor substrate at each step of steps S4 to S6, so that an effect of improving in-plane (wafer in-plane, semiconductor substrate in-plane) evenness of a shape and a gate length of a gate electrode can be obtained. Accordingly, variations in performance of a semiconductor device can be prevented so that performance or manufacture yield of a semiconductor device can be improved.

Third Embodiment

In a third embodiment, a gate electrode 5a can be formed in the same manner as the first embodiment, but a semiconductor substrate in-plane distribution of a gate length of the gate electrode 5a is controlled by controlling semiconductor substrate in-plane distributions of a deposition rate of the passivation film 23 at step S4, an etching rate of the passivation film 23 (and the antireflection film 21) at step S5, and an etching rate of the polycrystalline silicon film 5 at step S6. Since each step of steps S4 to S6 is similar to that in the first embodiment except for the semiconductor substrate in-plane distributions of the deposition rate of the passivation film 23, the etching rate of the passivation film 23 (and the antireflection film 21), and the etching rate of the polycrystalline silicon film 5, explanation thereof is omitted.

FIG. 25 shows graphs showing in-plane distributions in a semiconductor substrate of a gate length and a process rate (a deposition rate or an etching rate) at a formation step of a resist pattern 22 at step S3, at a deposition step of a passivation film 23 at step S4, at an etching step of the passivation film 23 and an organic antireflection film 21 at step S5, and at an etching step of a polycrystalline silicon film 5 at step S6.

Figure 25A:
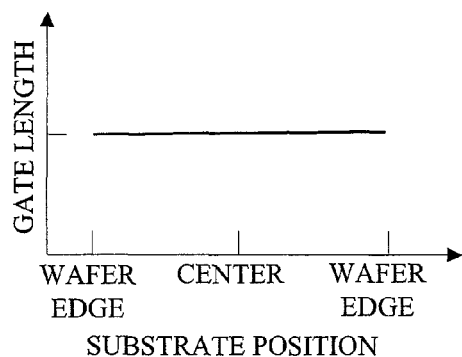
FIG. 25 shows graphs showing an in-plane distribution of a semiconductor substrate of a gate length and a process rate at a resist pattern formation step, a passivation film deposition step, an etching step of a passivation film and a antireflection film, and an etching step of a polycrystalline silicon film.
Figure 25B:
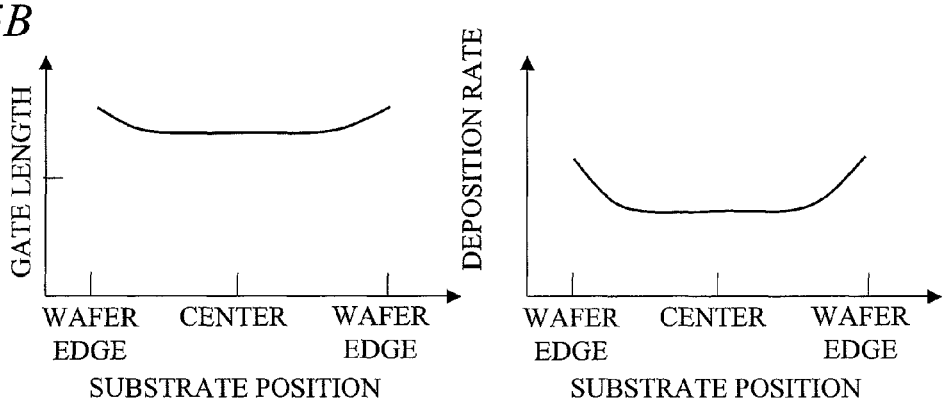
Figure 25C:
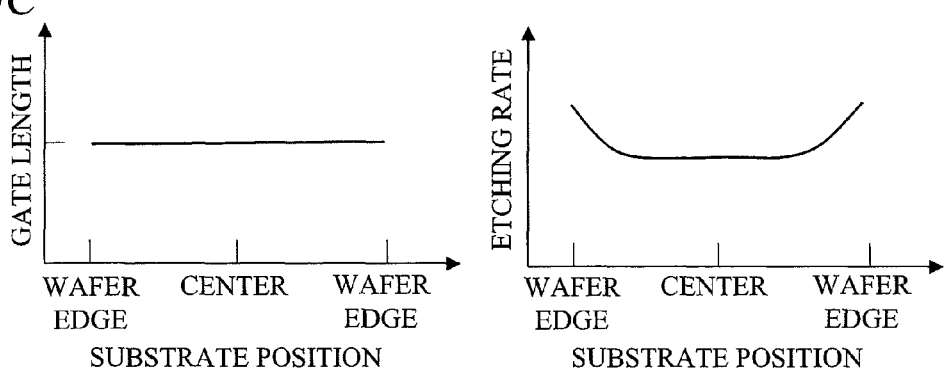
Figure 25D:
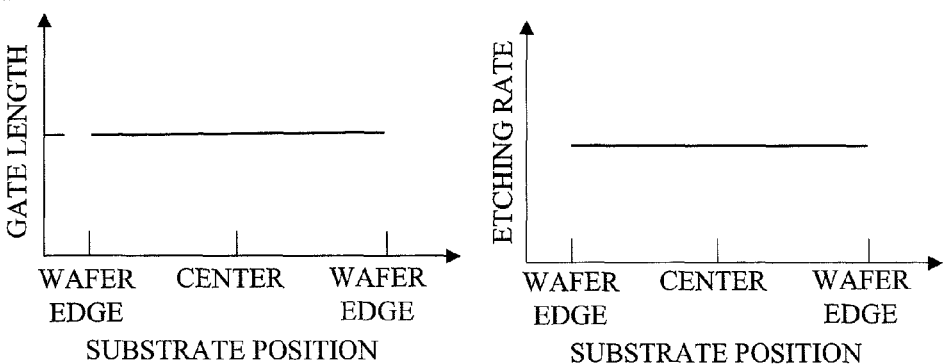

At first, as step S4, a passivation film 23 is deposited on an antireflection film 21 so as to cover a resist pattern 22. At this time, when an in-plane distribution (an in-plane distribution of a principal face of a semiconductor substrate) occurs in deposition rate of the passivation film 23, since a deposition film thickness becomes thick at a wafer peripheral portion (a wafer edge, an outer peripheral portion of a semiconductor substrate) where the deposition rate is fast, the gate length becomes thick. Next, though the passivation film 23 and the organic antireflection film 21 are etched at step S5, when the etching rate at this time is even within the plane (within the plane of the principal face of the semiconductor substrate 1), there is a possibility that the gate length at the wafer outer peripheral portion becomes thick due to the gate length at step S4. In general, the gate length becomes thinner according to increase of the etching rate. In the present embodiment, therefore, the in-plane distribution of the etching rate at step S5 is made relatively high at the outer peripheral portion of the wafer and it is made relatively low at the central portion of the wafer as shown in FIG. 25C. That is, in the present embodiment, the in-plane distribution in the semiconductor substrate 1 of the etching rate of the passivation film 23 at step S5 is controlled according to the in-plane distribution in the semiconductor substrate 1 of the deposition film thickness of the passivation film 23 at step S4. Thereby, it is made possible to make the in-plane distribution of the gate length even again by optimizing the in-plane distribution of the etching rate at step S4 to the distribution of the gate length at step S3. Thus, as the method for controlling the in-plane distribution of the deposition rate or the etching rate, a method for controlling a plasma distribution by addition of inert gas or application of magnetic field from an external coil, a method for controlling an in-plane distribution of reaction products according to gas introduction from a plurality of directions, a control method for an in-plane distribution of a bias applied to an electrode, and the like are proposed. The method for controlling a temperature distribution of an electrode described in the second embodiment is also effective.

As described above, by controlling the in-plane distributions of the deposition rate or the etching rate for each step of steps S4 to S6, a gate electrode with line edge roughness of about 2 nm, a size change amount of about −10 nm and in-plane evenness of about 1 nm can be formed, for example.

Thus, in the present embodiment, by controlling the semiconductor substrate in-plane distributions of the deposition rate of the passivation film 23 at step S4, the etching rate of the passivation film 23 (and the antireflection film 21) at step S5, and the etching rate of the polycrystalline silicon film 5 at step S6, the in-plane (the wafer in-plane, the semiconductor substrate in-plane) evenness of the shape and the gate length of the gate electrode can be improved. Accordingly, variations in performance of a semiconductor device can be prevented so that performance or manufacture yield of a semiconductor device can be improved.

Fourth Embodiment

Though the organic antireflection film 21 is used in the first embodiment, in a fourth embodiment, an inorganic antireflection film 21a is used instead of the organic antireflection film 21. Accordingly, the antireflection film 21 is made from organic material containing carbon in the first embodiment, but the antireflection film 21a is made from inorganic material (inorganic insulating material, for example, acidic silicon nitride film) which does not contain carbon in the fourth embodiment.

Figure 26:
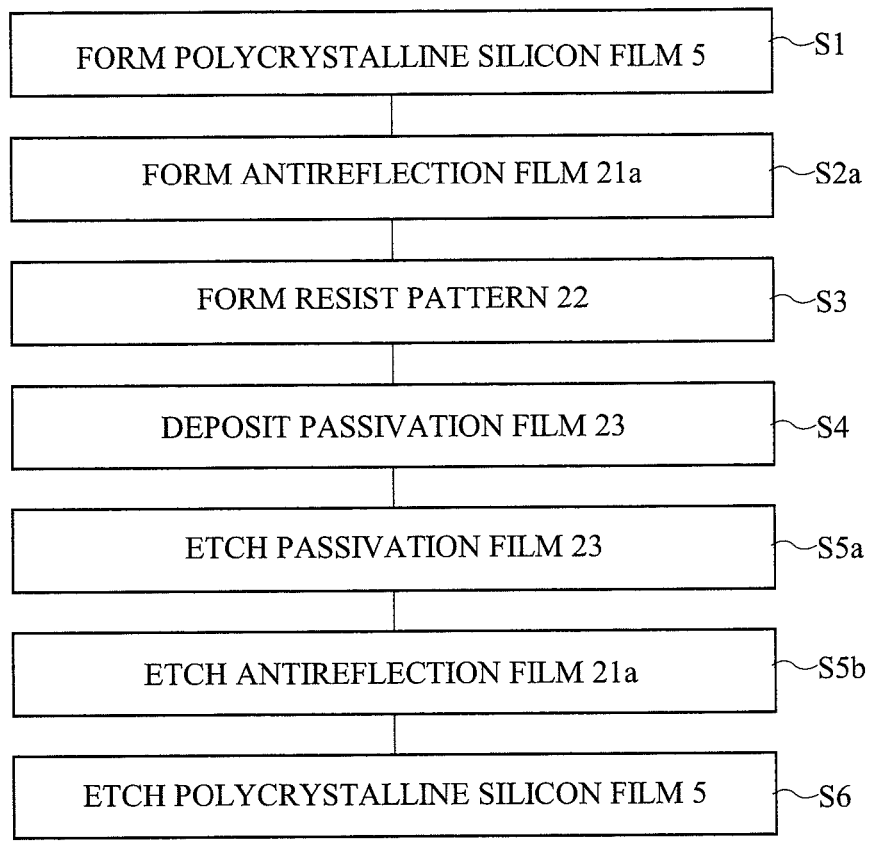
FIG. 26 is a process flowchart of a gate electrode formation step of a fourth embodiment of the present invention.

FIG. 26 is a process flowchart (an explanatory diagram) of a formation step of the gate electrode 5a according to the present embodiment. FIG. 27 to FIG. 31 are sectional views of a main part during manufacture step of a semiconductor device according to the present embodiment and are sectional views of the main part of a region near a gate electrode during formation (process) step of the gate electrode 5a.

Figure 27:
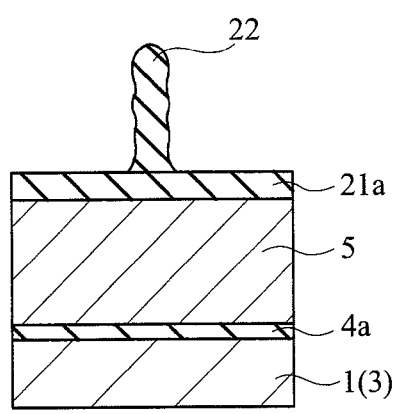
FIG. 27 is a sectional view of a main part during a gate electrode formation step of the fourth embodiment of the present invention.

In the present embodiment, after a polycrystalline silicon film 5a is formed on a semiconductor substrate 1 (a p-type well 3) via an insulating film 4a for a gate insulating film (step S1), an inorganic antireflection film 21a is formed on the polycrystalline silicon film 5 (step S2a) like the first embodiment, as shown in FIG. 27. The antireflection film 21a is formed for suppressing formation of an abnormal pattern due to reflection interference of laser, and it is made from inorganic material which does not contain carbon (C). Then, a resist pattern 22 is formed on the antireflection film 21a (step S3) like the first embodiment. The resist pattern 22 is a resist pattern corresponding to ArF lithography.

Figure 28:
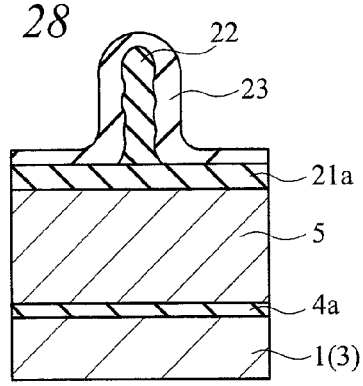
FIG. 28 is a sectional view of the main part during a gate electrode formation step following the step shown in FIG. 27.

Next, as shown in FIG. 28, a passivation film 23 is deposited on the antireflection film 21a so as to cover the resist pattern 22 (step S4) like the first embodiment. For example, the passivation film 23 can be deposited according to the condition $A_1$ or the like.

Figure 29:
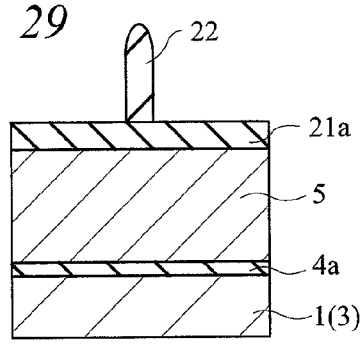
FIG. 29 is a sectional view of the main part during a gate electrode formation step following the step shown in FIG. 28.
Figure 30:
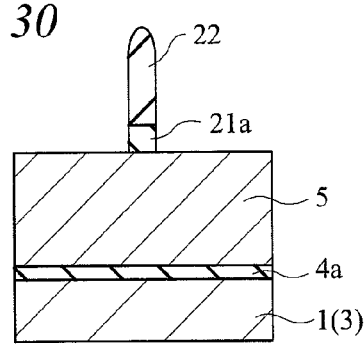
FIG. 30 is a sectional view of the main part during a gate electrode formation step following the step shown in FIG. 29.

Next, as shown in FIG. 29, the passivation film 23 is etched (removed) (step S5a). At the etching step of the passivation film 23 at step S5a, the passivation film 23 can be etched according to an etching condition similar to that at step S5 of the first embodiment (the etching step of the passivation film 23 and the antireflection film 21), for example, the condition $B_1$. At this time, since oxygen ($O_2$) is contained in the process gas, the inorganic antireflection film 21a which is the base is hardly etched (removed). Therefore, after the passivation film 23 is etched at step S4a, as shown in FIG. 30, the inorganic antireflection film 21a is etched (removed) (step S5b). At this time, since the resist pattern 22 functions as the etching mask, the antireflection film 21a positioned below the resist pattern 22 remains, so that the antireflection film 21a which is positioned in a region where the antireflection film 21a is not covered with the resist pattern 22 is selectively etched and removed.

Figure 31:
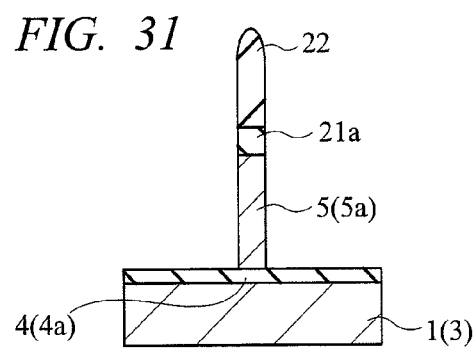
FIG. 31 is a sectional view of the main part during a gate electrode formation step following the step shown in FIG. 30.

Thereafter, as shown in FIG. 31, the polycrystalline silicon film 5 is etched (removed) using the resist pattern 2 as the etching mask to process the gate electrode 5a according to, for example, the condition $C_1$ at step S6 like the first embodiment.

In the present embodiment, since the line edge roughness of the resist pattern 22 is reduced by performing the deposition step of the passivation film 23 at step S4 and the etching step of the passivation film 23 at step S5a and the gate electrode 5a is formed by dry-etching the polycrystalline silicon film 5 using the resist pattern with the reduced line edge roughness as the etching mask like the first embodiment, the line edge roughness of the gate electrode 5a can be reduced.

By forming the gate electrode 5a in this manner, a gate electrode with reduced line edge roughness, for example, a gate electrode with line edge roughness of about 2 nm, a size change amount of about 0 nm can be formed.

In the present embodiment, an effect approximately similar to the first embodiment can be obtained. For example, since the line edge roughness of the resist pattern can be reduced, a gate electrode with reduced line edge roughness can be formed. Since the size of the resist pattern and the line edge roughness reduction amount can be controlled independently of each other and the resist remaining film amount can be secured sufficiently, the process size of a gate electrode with reduced line edge roughness can be controlled at high process precision. Accordingly, performance of a semiconductor device can be improved. Further, productivity of a semiconductor device can be improved and manufacture yield of a semiconductor device can be improved.

Fifth Embodiment

The resist pattern corresponding to the ArF lithography is used as the resist pattern 22 in the first embodiment, but a resist pattern 22a corresponding to electron beam lithography is used instead of the resist pattern 22 corresponding to the ArF lithography in a fifth embodiment. Also, in the fifth embodiment, since the resist pattern 22a is formed using the electron beam lithography, formation of the antireflection film 21 can be omitted.

Figure 32:
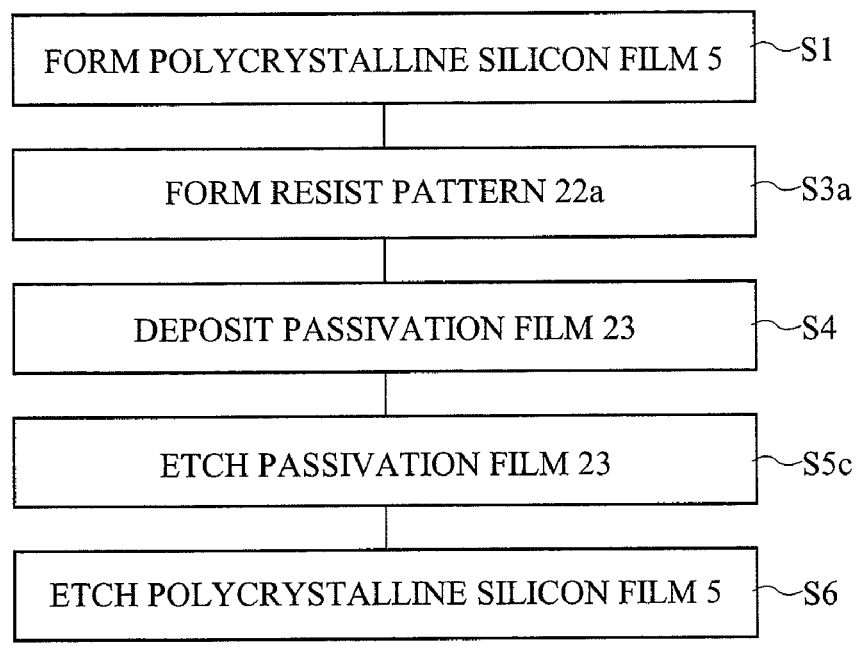
FIG. 32 is a process flowchart of a gate electrode formation step of a fifth embodiment of the present invention.

FIG. 32 is a process flowchart (an explanatory diagram) of a formation step of a gate electrode 5a according to the fifth embodiment. FIG. 33 to FIG. 36 are sectional views of a main part during manufacture step of a semiconductor device according to the present embodiment and are sectional views of the main part of a region near a gate electrode during formation (process) step of the gate electrode 5a.

Figure 33:
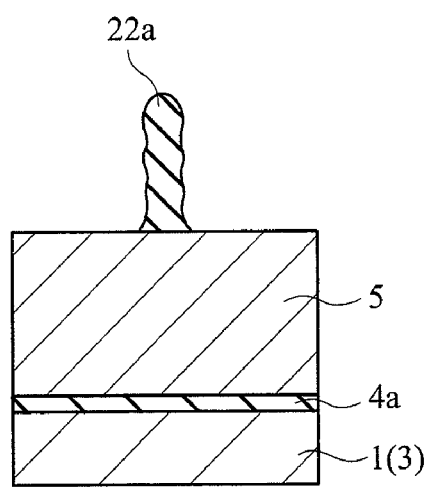
FIG. 33 is a sectional view of a main part during a gate electrode formation step of the fifth embodiment of the present invention.

In the present embodiment, after a polycrystalline silicon film 5 is formed on a semiconductor substrate 1 (a p-type well 3) via an insulating film 4a for a gate insulating film (step S1) like the first embodiment, formation of an antireflection film is omitted and a resist pattern 22a is formed on the polycrystalline silicon film 5 (step S3a) as shown in FIG. 33. The resist pattern 22a is a resist pattern formed using electron beam lithography. For example, the resist pattern 22a can be formed by forming a photoresist layer on a polycrystalline silicon film 5, exposing the photoresist layer using electron beam, and developing the same.

Figure 34:
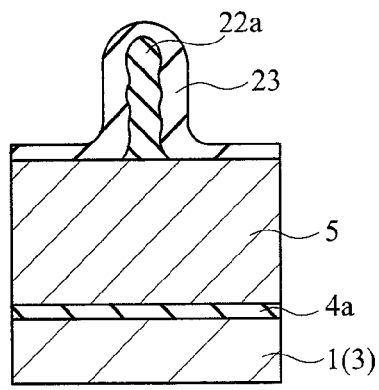
FIG. 34 is a sectional view of the main part during a gate electrode formation step following the step shown in FIG. 33.

Next, as shown in FIG. 34, a passivation film 23 is deposited on the polycrystalline silicon film 5 so as to cover the resist pattern 22a (step S4) like the first embodiment. For example, the passivation film 23 can be formed according to the condition $A_1$ or the like.

Figure 35:
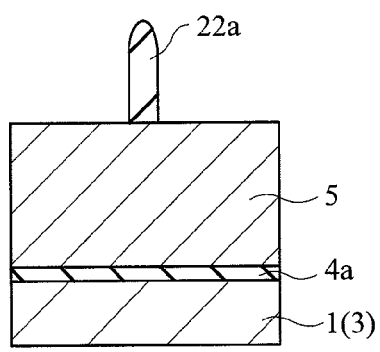
FIG. 35 is a sectional view of the main part during a gate electrode formation step following the step shown in FIG. 34.

Next, as shown in FIG. 35, the passivation film 23 is etched (removed) (step S5c). At the etching step of the passivation film 23 at step S5c, the passivation film 23 can be etched according to an etching condition similar to that at step S5 of the first embodiment (the etching steps of the passivation film 23 and the antireflection film 21), for example, the condition $B_1$. At this time, since oxygen ($O_2$) is contained in the process gas, the polycrystalline silicon film 5 which is the base is hardly etched (removed).

Figure 36:
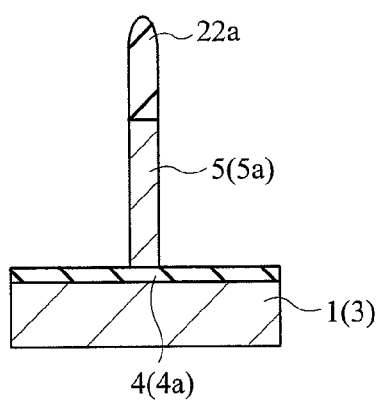
FIG. 36 is a sectional view of the main part during a gate electrode formation step following the step shown in FIG. 35.

Thereafter, as shown in FIG. 36, the polycrystalline silicon film 5 is etched (removed) using the resist pattern 22a as the etching mask to process the gate electrode 5a, for example, according to the condition $C_1$ at step S6 like the first embodiment.

In the present embodiment, like the first embodiment, since the line edge roughness of the resist pattern 22a is reduced by performing the deposition step of the passivation film 23 at step S4 and the etching step of the passivation film 23 at step S5c and the gate electrode 5a is formed by dry-etching the polycrystalline silicon film 5 using the resist pattern 22a with reduced line edge roughness as the etching mask, the line edge roughness of the gate electrode 5a can be reduced.

A gate electrode with reduced line edge roughness, for example, a gate electrode with line edge roughness of about 2 nm and a size change amount of about 0 nm can be formed by forming the gate electrode 5a in this manner.

In the present embodiment, an effect similar to that in the first embodiment can be obtained. For example, since the line edge roughness of the resist pattern can be reduced, a gate electrode with reduced line edge roughness can be formed. Since the size of the resist pattern and the line edge roughness reduction amount can be controlled independently of each other and the resist remaining film amount can be secured sufficiently, the process size of a gate electrode with reduced line edge roughness can be controlled at high process precision. Accordingly, performance of a semiconductor device can be improved. Also, productivity of a semiconductor device can be improved and manufacture yield of a semiconductor device can be improved.

Sixth Embodiment

The antireflection film 21 and the resist pattern 22 are formed on the polycrystalline silicon film 5 in the first embodiment, but an insulating film 24 for a hard mask is formed on the polycrystalline silicon film 5, and the antireflection film 21 and the resist pattern 22 are formed on the insulating film 24 in a sixth embodiment.

Figure 37:
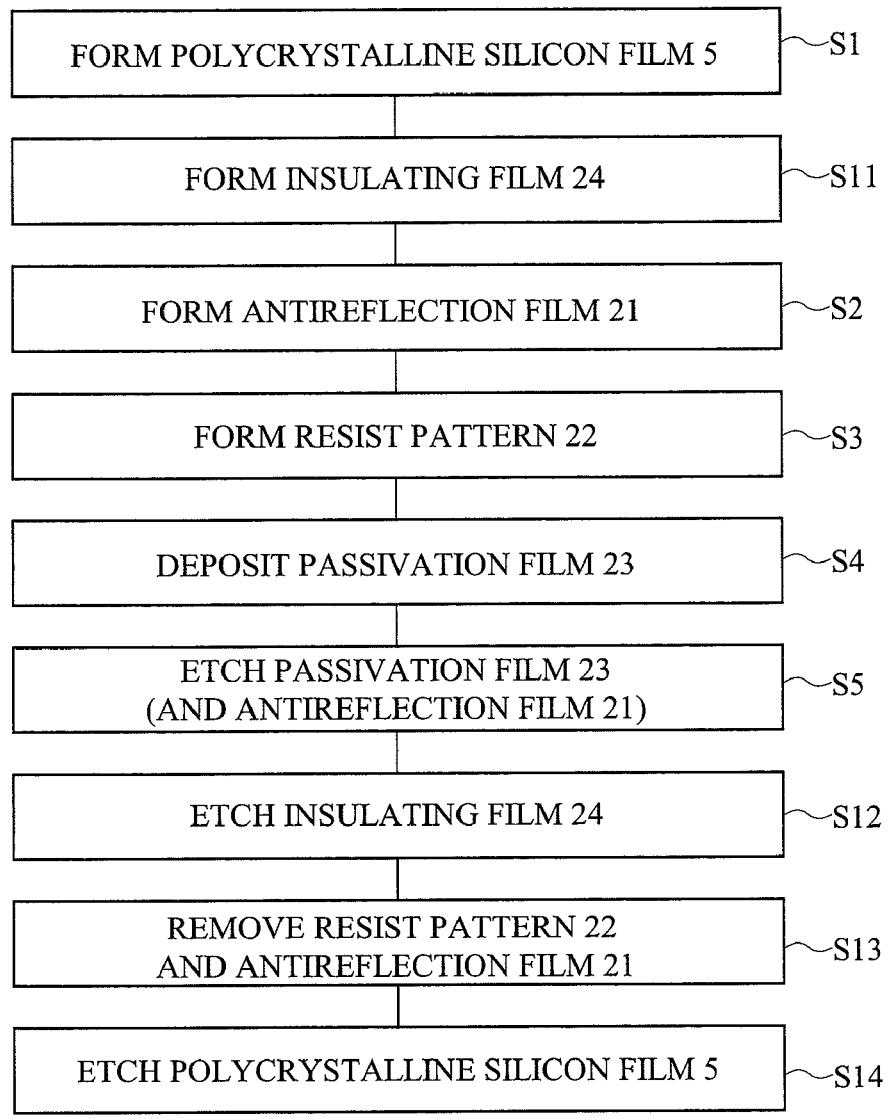
FIG. 37 is a process flowchart of a gate electrode formation step of a sixth embodiment of the present invention.

FIG. 37 is a process flowchart (an explanatory diagram) of a formation step of a gate electrode 5a according to the present embodiment. FIG. 38 to FIG. 43 are sectional views of a main part during manufacture step of a semiconductor device according to the present embodiment and are sectional views of the main part of a region near a gate electrode during formation (process) step of the gate electrode 5a.

Figure 38:
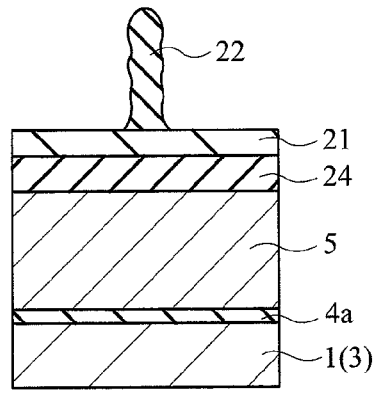
FIG. 38 is a sectional view of a main part during a gate electrode formation step of the sixth embodiment of the present invention.

In the present embodiment, as shown in FIG. 38, after a polycrystalline silicon film 5 is formed on a semiconductor substrate 1 (a p-type well 3) via an insulating film 4a for a gate insulating film (step S1), an insulating film 24 for a hard mask is formed on the polycrystalline silicon film 5 (step S11). The insulating film 24 is made of, for example, a silicon oxide film. Then, an antireflection film 21 is formed on the insulating film 24 (step S2). The antireflection film 21 is formed for suppressing formation of an abnormal pattern due to reflection interference of laser, and it is made from, for example, organic material containing carbon (C). Then, a resist pattern 22 is formed on the antireflection film 21 like the first embodiment (step S3).

Figure 39:
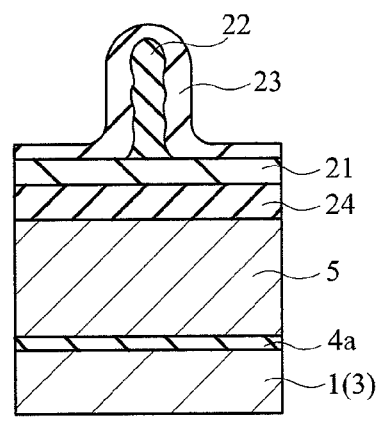
FIG. 39 is a sectional view of the main part during a gate electrode formation step following the step shown in FIG. 38.

Next, as shown in FIG. 39, a passivation film 23 is deposited on the antireflection film 21 so as to cover the resist pattern 22 (step S4) like the first embodiment. For example, the passivation film 23 can be deposited, for example, according to the condition $A_1$ or the like.

Figure 40:
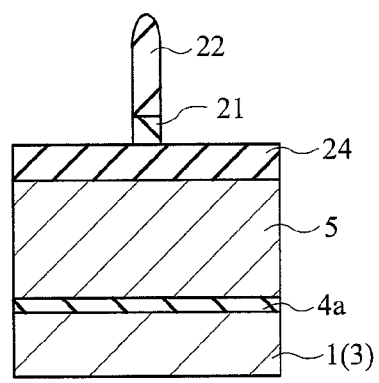
FIG. 40 is a sectional view of the main part during a gate electrode formation step following the step shown in FIG. 39.

Next, the passivation film 23 is etched (removed) (step S5). At the etching step of the passivation film 23 at step S5, the passivation film 23 can be etched according to an etching condition similar to that at step S5 of the first embodiment (the etching step of the passivation film 23 and the antireflection film 21), for example, the condition $B_1$. At this time, since oxygen ($O_2$) is contained in the process gas, the organic antireflection film 21 which is the base can also be etched (removed). Accordingly, as shown in FIG. 40, the passivation film 23 containing carbon and the organic antireflection film 21 can be etched at step S5. Since the resist pattern 22 can function as the etching mask for the antireflection film 21 at step S5, the antireflection film 21 positioned below the resist pattern 22 remains so that a portion of the antireflection film 21 which is positioned in a region where the antireflection film 21 is not covered with the resist pattern 22 is selectively etched and removed.

Figure 41:
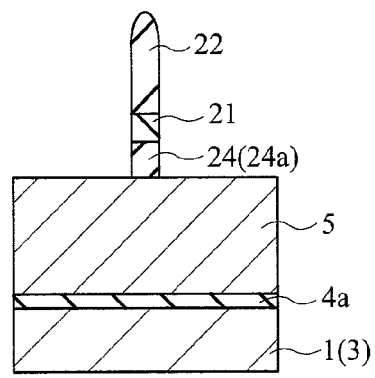
FIG. 41 is a sectional view of the main part during a gate electrode formation step following the step shown in FIG. 40.

Next, as shown in FIG. 41, the insulating film 24 is etched (removed, or dry-etched) using the resist pattern 22 as the etching mask and a hard mask 24a made of the patterned insulating film 24 is processed (formed) (step S12). Since the line edge roughness of the resist pattern 22 is reduced by performing the deposition step of the passivation film 23 at step S4 and the etching step of the passivation film 23 at step S5 like the first embodiment and the hard mask 24a is formed by dry-etching the insulating film 24 using the resist pattern 22 with the reduced line edge roughness as the etching mask, the line edge roughness of the hard mask 24a can be reduced.

Figure 42:
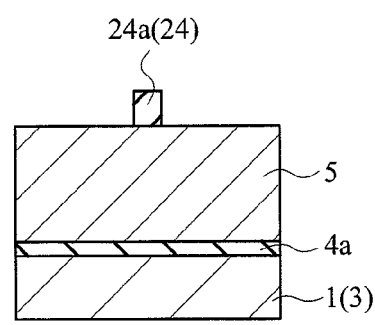
FIG. 42 is a sectional view of the main part during a gate electrode formation step following the step shown in FIG. 41.

Next, as shown in FIG. 42, the resist pattern 22 and the antireflection film 21 are removed by ashing or the like (step S13).

Figure 43:
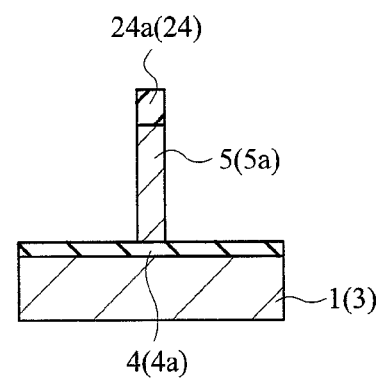
FIG. 43 is a sectional view of the main part during a gate electrode formation step following the step shown in FIG. 42.

Thereafter, as shown in FIG. 43, the polycrystalline silicon film 5 is etched (removed) using the hard mask 24a (namely, the insulating film 24) as the etching mask to process (form) a gate electrode 5a (step S14). Since the line edge roughness of the hard mask 24a is reduced and the polycrystalline silicon film 5 is dry-etched using the hard mask 24a with the reduced line edge roughness as the etching mask to form the gate electrode 5a, the line edge roughness of the gate electrode 5a can be reduced.

In the present embodiment, the line edge roughness of the hard mask 24a is reduced in this manner by applying the present invention to processing of the hard mask 24a, so that the line edge roughness of the gate electrode 5a processed using the hard mask 24a as the etching mask can be reduced. Also, in the present embodiment, the example where the resist pattern 22 is removed by ashing after the hard mask 24a is processed has been explained but a similar effect can be obtained even when a consistent process up to the polycrystalline silicon film 5 is performed without removing the resist pattern 22.

In the present embodiment, an effect similar to that in the first embodiment can be obtained. For example, since the hard mask is formed using the resist pattern with the reduced line edge roughness and the gate electrode is formed using the hard mask, a gate electrode with reduced line edge roughness can be formed. Since the size of the resist pattern and the line edge roughness reduction amount can be controlled independently of each other and the resist remaining film amount can be secured sufficiently, the process size of a gate electrode with reduced line edge roughness can be controlled at high process precision. Accordingly, performance of a semiconductor device can be improved. Also, productivity of a semiconductor device can be improved and manufacture yield of a semiconductor device can be improved.

Seventh Embodiment

The gate electrode 5a is formed by patterning the polycrystalline silicon film 5 in the first embodiment, but a metal film 25 is used instead of the polycrystalline silicon film 5 and a gate electrode 5b is formed as a metal gate electrode by patterning the metal film 25 in a seventh embodiment.

Figure 44:
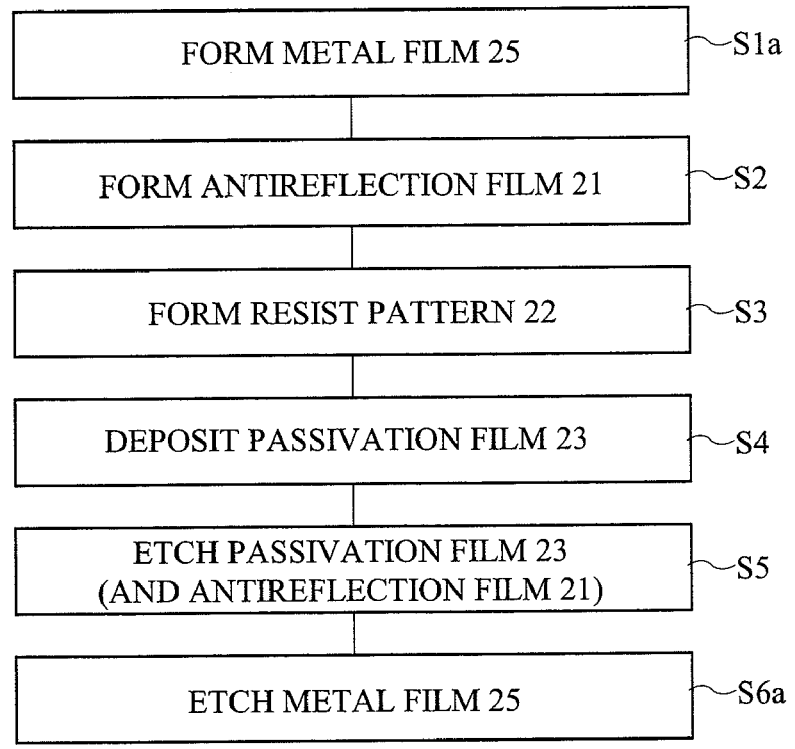
FIG. 44 is a process flowchart of a gate electrode formation step of a seventh embodiment of the present invention.

FIG. 44 is a process flowchart (an explanatory diagram) of a formation step of the gate electrode 5b according to the present embodiment. FIG. 45 to FIG. 48 are sectional views of a main part during manufacture step of a semiconductor device according to the present embodiment and are sectional views of the main part of a region near a gate electrode during formation (process) step of the gate electrode 5b.

In the present embodiment, as shown in FIG. 45, a metal film 25 is formed on a semiconductor substrate 1 (a p-type well 3) via an insulating film 4a for a gate insulating film instead of the polycrystalline silicon film 5 of the first embodiment (step S1a). The metal film 25 is made of, for example, titanium silicide film or the like. In the present embodiment, it is preferable that a so-called High-k film (high dielectric film) such as hafnium oxide ($HfO_2$) is used as the insulating film 4a.

Next, an antireflection film 21 is formed on the metal film 25 (step S2). The antireflection film 21 is formed for suppressing formation of an abnormal pattern due to reflection interference of laser, and it is made from, for example, organic material containing carbon (C). Then, a resist pattern 22 is formed on the antireflection film 21 like the first embodiment (step S3). The resist pattern 22 is a resist pattern corresponding to ArF lithography.

Next, as shown in FIG. 46, a passivation film 23 is deposited on the antireflection film 21 so as to cover the resist pattern 22 like the first embodiment (step S4). For example, the passivation film 23 can be deposited, for example, according to the condition $A_1$ or the like.

Next, the passivation film 23 is etched (removed) (step S5). At the etching step of the passivation film 23 at step S5, the passivation film 23 can be etched according to an etching condition similar to that at step S5 of the first embodiment (the etching step of the passivation film 23 and the antireflection film 21), for example, the condition $B_1$. At this time, since oxygen ($O_2$) is contained in the process gas, the organic antireflection film 21 which is the base can also be etched (removed). Accordingly, as shown in FIG. 47, the passivation film 23 containing carbon and the organic antireflection film 21 can be etched at step S5. Since the resist pattern 22 can function as the etching mask for the antireflection film 21 at step S5, the antireflection film 21 positioned below the resist pattern 22 remains so that a portion of the antireflection film 21 which is positioned in a region where the antireflection film 21 is not covered with the resist pattern 22 is selectively etched and removed.

Next, as shown in FIG. 48, the metal film 25 is etched (removed) using the resist pattern 22 as the etching mask to process (form) a gate electrode 5b made of the patterned metal film 25 (step S6a). The gate electrode 5a made from the patterned polycrystalline silicon film 5 is formed in the first embodiment, but the gate electrode 5b made of the patterned metal film 25, namely, the gate electrode 5b as a metal gate electrode is formed instead of the gate electrode 5a in the seventh embodiment.

In the present embodiment, as same with the first embodiment, since the line edge roughness of the resist pattern 22 is reduced by performing the deposition step of the passivation film 23 at step S4 and the etching step of the passivation film 23 at step S5 and the gate electrode 5b is formed by dry-etching the metal film 25 using the resist pattern 22 with the reduced line edge roughness, the line edge roughness of the gate electrode 5b can be reduced. By forming the gate electrode 5b in this manner, a gate electrode (a metal gate electrode) with reduced line edge roughness can be formed.

In the present embodiment, an effect similar to that in the first embodiment can be obtained. For example, since the line edge roughness of the resist pattern can be reduced, a gate electrode with reduced line edge roughness can be formed. Also, since the size of the resist pattern and the line edge roughness reduction amount can be controlled independently of each other and the resist remaining film amount can be secured sufficiently, the process size of a gate electrode with reduced line edge roughness can be controlled at high process precision. Accordingly, performance of a semiconductor device can be improved. Productivity of a semiconductor device can be improved and manufacture yield of a semiconductor device can be improved.

Also, in the present embodiment, the structure where the titanium silicide film is used as the metal gate electrode 5b (the metal film 25) and the hafnium oxide film is used as the gate insulating film (the insulating film 4a) has been explained as the example, but the present invention is not limited to this example. For example, even when another material such as nickel silicide is used as the metal gate electrode 5b (the metal film 25) or even when a laminated structure of different materials such as a laminated film of a tungsten silicide film and a polycrystalline silicon film is used as the metal gate electrode 5b (the metal film 25), similar effect can be obtained.

Eighth Embodiment

The present invention is applied to a formation step of a gate electrode in the first embodiment, but the present invention is applied to a step of forming a device isolation trench 2a for a device isolation region 2 in an eighth embodiment.

FIG. 49 is a process flowchart (an explanatory diagram) for a device isolation trench (a Si trench) 2a of the present embodiment. FIG. 50 to FIG. 54 are sectional views of a main part during manufacture step of a semiconductor device according to the present embodiment and are sectional views of the main part of a region near a device isolation trench (an Si trench) 2a during formation (process) step of the device isolation trench (the Si trench) 2a.

In the present embodiment, the device isolation trench 2a for a device isolation region 2 can be formed in the following manner.

At first, as shown in FIG. 50, a silicon nitride film 26 is formed on a semiconductor substrate 1 (step S21). Next, an organic antireflection film 21 is formed on the silicon nitride film 26 (step S22). The antireflection film 21 is formed for suppressing formation of an abnormal pattern due to reflection and interference of laser for exposure and it is made from, for example, organic material (organic insulating film) containing carbon (C). Then, a resist pattern 22 is formed on the antireflection film 21 like the first embodiment (step S23). The resist pattern 22 is a resist pattern corresponding to ArF lithography.

Next, as shown in FIG. 51, a passivation film 23 is deposited on the antireflection film 21 so as to cover the resist pattern 22 (step S24) like step S4 of the first embodiment. For example, the passivation film 23 can be deposited, for example, according to the condition $A_1$ or the like.

Next, the passivation film 23 is etched (removed) like step S5 of the first embodiment (step S25). At the etching step of the passivation film 23 at step S25, the passivation film 23 can be etched according to an etching condition similar to that of step S5 of the first embodiment (the etching step of the passivation film 23 and the antireflection film 21), for example, the condition $B_1$. At this time, since oxygen ($O_2$) is contained in the process gas, the organic antireflection film 21 which is the base can be etched (removed). Therefore, as shown in FIG. 52, the passivation film 23 containing carbon and the organic antireflection film 21 can be etched at step S25. Since the resist pattern 22 can function as the etching mask for the antireflection film 21 at step S25, the antireflection film 21 below the resist pattern 22 remains, and the antireflection film 21 positioned on a region where it is not covered with the resist pattern 22 is selectively etched and removed.

Next, as shown in FIG. 53, patterning is performed by etching (removing, dry-etching) the silicon nitride film 26 using the resist pattern 22 as the etching mask (step S26). Then, as shown in FIG. 54, a device isolation trench 2a is formed in the semiconductor substrate 1 by etching (removing, dry-etching) the semiconductor substrate 1 using the resist pattern 22 as the etching mask (step S27). Thereafter, a device isolation region 2 made of an insulating film embedded in the device isolation trench 2a can be formed by embedding a silicon oxide film in the device isolation trench 2a and performing a CMP processing or the like to the silicon oxide film.

In the present embodiment, the line edge roughness of the resist pattern 22 is reduced by performing the deposition step of the passivation film 23 at step S24 and the etching step of the passivation film 23 at step S25 and a device isolation trench 2a is formed by dry-etching the silicon nitride film 26 and the semiconductor substrate 1 using the resist pattern 22 with the reduced line edge roughness as the etching mask, thereby the line edge roughness of the device isolation trench 2a can be reduced.

Thus, in the present embodiment, process of the Si trench (the device isolation trench 2a) with the reduced line edge roughness is made possible by application of the present invention, and process precision of the device isolation layer (device isolation region 2) utilizing the Si trench (the device isolation trench 2a) is improved, so that improvement of the device performance can be expected. Also, in the present embodiment, although the method for utilizing the resist pattern 22 as the mask to apply consistent process to the silicon nitride film 26 and the semiconductor substrate 1 and forming the Si trench (the device isolation trench 2a) has been explained as the example, as another embodiment, a method for removing the resist pattern 22 and the organic antireflection film 21 after the silicon nitride 26 is processed (etched) at step S26, and etching the semiconductor substrate 1 using the patterned silicon nitride film 26 as the etching mask (the hard mask) to form the device isolation trench 2a can be adopted, and in this case, a similar effect can be obtained. The second to sixth embodiments may be combined to the eighth embodiment.

Ninth Embodiment

The present invention is applied to the formation step of the gate electrode in the first embodiment, but it is applied to a step of forming an interconnect 14 in a ninth embodiment.

FIG. 55 is a process flowchart (an explanatory diagram) of a formation step of an interconnect 14 according to the ninth embodiment. FIG. 56 to FIG. 59 are sectional views of a main part during manufacture step of a semiconductor device according to the present embodiment and are sectional views of the main part of a region near an interconnect 14 during a formation step of the interconnect 14.

The interconnect 14 can be formed in this embodiment in the following manner.

At first, as shown in FIG. 56, a conductor film (a metal film) 27 is formed on an insulating film (an interlayer insulating film) 11 (step S31). The conductor film 27 is made from, for example, metal material mainly containing aluminum, and it is a laminated film composed of, for example, a titanium film (corresponding to the titanium film 14a), a titanium nitride film (corresponding to the titanium nitride film 14b), an aluminum film (corresponding to the aluminum film 14c), a titanium film (corresponding to the titanium film 14d), and a titanium nitride film (corresponding to the titanium nitride film 14e) formed in the ascending order thereof. Tungsten or the like can be used as the conductor film 27.

Next, an organic antireflection film 21 is formed on the conductor film 27 (step S32). The antireflection film 21 is formed for suppressing formation of an abnormal pattern due to reflection interference of laser, and it is made from, for example, organic material containing carbon (C). Then, a resist pattern 22 is formed on the antireflection film 21 like the first embodiment (step S33). The resist pattern 22 is a resist pattern corresponding to ArF lithography.

Next, as shown in FIG. 57, a passivation film 23 is deposited on the antireflection film 21 so as to cover the resist pattern 22 (step S34) like the first embodiment. For example, the passivation film 23 can be deposited according to the condition $A_1$ or the like.

Next, the passivation film 23 is etched (removed) like step S5 of the first embodiment (step S35). At the etching step of the passivation film 23 at step S35, the passivation film 23 can be etched according to an etching condition similar to that of step S5 of the first embodiment (the etching step of the passivation film 23 and the antireflection film 21), for example, the condition $B_1$. At this time, since oxygen ($O_2$) is contained in the process gas, the inorganic antireflection film 21a which is the base can be etched (removed). Therefore, as shown in FIG. 58, the passivation film 23 containing carbon and the organic antireflection film 21 can be etched at step S35. Since the resist pattern 22 can function as an etching mask for the antireflection film 21 at step S35, the antireflection film 21 below the resist pattern 22 remains, and a portion of the antireflection film 21 positioned on a region where it is not covered with the resist pattern 22 is selectively etched and removed.

Next, as shown in FIG. 59, patterning is performed by etching (removing, dry-etching) the conductor film 27 using the resist pattern 22 as the etching mask (step S46). Thereby, an interconnect 14 composed of the patterned conductor film 27 is formed.

In the present embodiment, like the first embodiment, since the line edge roughness of the resist pattern 22 is reduced by performing the deposition step of the passivation film 23 at step S34 and the etching step of the passivation film 23 at step S35 and the interconnect 14 is formed by dry-etching the conductor film 27 using the resist pattern 22 with the reduced line edge roughness as the etching mask, the line edge roughness of the interconnect 14 can be reduced. A wire with reduced line edge roughness can be formed by forming the interconnect 14 in this manner.

In the present embodiment, an effect similar to that in the first embodiment can be obtained. For example, since the line edge roughness of the resist pattern can be reduced, a wire with reduced line edge roughness can be formed. Since the size of the resist pattern and the line edge roughness reduction amount can be controlled independently of each other and the resist remaining film amount can be secured sufficiently, the process size of a gate electrode with reduced line edge roughness can be controlled at high process precision. Accordingly, performance of a semiconductor device can be improved. Productivity of a semiconductor device can be improved and manufacture yield of a semiconductor device can be improved.

Tenth Embodiment

The present invention is applied to the formation step of the gate electrode in the first embodiment, but it is applied to a formation step of an opening portion (a hole or a groove) to an insulating film in a tenth embodiment.

FIG. 60 is a process flowchart (an explanatory diagram) of a formation step of an opening portion (a hole or a groove) to an insulating film in the tenth embodiment. FIG. 61 to FIG. 64 are sectional views of a main part during manufacture step of a semiconductor device according to the present embodiment and are sectional views of the main part of a region near an opening portion during a formation step of an opening portion to an insulating film.

At first, as shown in FIG. 61, an insulating film 28 is formed on a semiconductor substrate 1 (step 41). The insulating film 28 corresponds to, for example, the insulating film (the interlayer insulating film) 11 of the first embodiment or the like.

Next, an organic antireflection film 21 is formed on the insulating film 28 (step S42). The antireflection film 21 is formed for suppressing formation of an abnormal pattern due to reflection interference of laser, and it is made from, for example, organic material containing carbon (C). Then, a resist pattern 22 is formed on the antireflection film 21 (step S43) like the first embodiment. The resist pattern 22 is a resist pattern corresponding to ArF lithography.

Next, as shown in FIG. 62, a passivation film 23 is deposited on the antireflection film 21 so as to cover the resist pattern 22 (step S44) like step S4 of the first embodiment. For example, the passivation film 23 can be deposited according to, for example, the condition $A_1$ or the like.

Next, the passivation film 23 is etched (removed) like step s5 of the first embodiment (step S45). At the etching step of the passivation film 23 at step S45, the passivation film 23 can be etched according to an etching condition similar to that at step S5 of the first embodiment (the etching step of the passivation film 23 and the antireflection film 21), for example, the condition $B_1$. At this time, since oxygen ($O_2$) gas is contained in the process gas, the organic antireflection film 21 which is the base can also be etched (removed). Accordingly, as shown in FIG. 63, the passivation film 23 containing carbon and the organic antireflection film 21 can be etched at step S45. Since the resist pattern 22 can function as the etching mask for the antireflection film 21 at step S35, the antireflection film 21 positioned below the resist pattern 22 remains, so that a portion of the antireflection film 21 which is positioned in a region where the antireflection film 21 is not covered with the resist pattern 22 is selectively etched and removed.

Next, as shown in FIG. 64, an opening portion (a hole or a groove) 29 is formed in the insulating film 28 by etching (removing, dry-etching) the insulating film 28 using the resist pattern 22 as the etching mask (step 36). The opening portion 29 formed in the insulating film 28 corresponds to, for example, the contract hole 12 or the like. The formation step of the opening portion 29 can be applied to formation of a hole or a groove for an embedded copper interconnect. Thereafter, a plug, an embedded interconnect, or the like can be formed by embedding a conductor film (a metal film) in the opening portion 29 to perform a CMP processing to the conductor film.

In the present embodiment, since the line edge roughness of the resist pattern 22 is reduced by performing the deposition step of the passivation film 23 at step S44 and the etching step of the passivation film 23 at step S45 and the opening portion 29 is formed by dry-etching the insulating film 28 using the resist pattern 22 with reduced line edge roughness as the etching mask, the line edge roughness of the opening portion 29 can be reduced.

In the present embodiment, since the line edge roughness of the resist pattern can be reduced, an opening portion with reduced line edge roughness can be formed, the line edge roughness of a plug formed by embedding conductor in the opening portion or an embedded copper interconnect can be reduced. The size of the resist pattern and the line edge roughness reduction amount can be controlled independently of each other. Accordingly, performance of a semiconductor device can be improved. Productivity of a semiconductor device can be improved and manufacture yield of a semiconductor device can be improved.

Eleventh Embodiment

The gate electrode 5a is formed by patterning a conductor film such as the polycrystalline silicon film 5 in the first embodiment, but a dummy gate electrode 5c is formed by patterning a conductor film such as the polycrystalline silicon film 5 and an embedding type gate electrode 5d is then formed by embedding a conductor film in an opening portion (a groove) formed by removing the dummy gate electrode 5c in an eleventh embodiment.

FIG. 65 to FIG. 70 are sectional views of a main part during manufacture step of a semiconductor device according to the present embodiment.

In the present embodiment, a structure shown in FIG. 6 corresponding to FIG. 4 can be obtained by performing steps similar to those in the first embodiment. The gate electrode 5a in the first embodiment corresponds to the dummy gate electrode 5c in the present embodiment. The dummy gate electrode 5c is formed by patterning the polycrystalline silicon film 5 like the gate electrode 5a of the first embodiment. That is, the dummy gate electrode 5c corresponding to the gate electrode 5a is formed according to steps S1 to S6 in the first embodiment. Since a formation step of the dummy gate electrode 5c is similar to the formation step of the gate electrode 5a, explanation thereof is omitted here. Since the line edge roughness of the resist pattern 22 is reduced by performing the deposition step of the passivation film 23 at step S4 and the etching step of the passivation film 23 at step S5c and the dummy gate electrode 5c is formed by dry-etching the polycrystalline silicon film 5 using the resist pattern 22 with reduced line edge roughness as the etching mask, the line edge roughness of the dummy gate electrode 5c can be reduced.

Next, as shown in FIG. 66, an upper face of the dummy gate electrode 5c is exposed by forming an insulating film 31 on the semiconductor substrate 1 so as to cover the dummy gate electrode 5c to perform a CMP processing or the like to the insulating film 31. The insulating film 31 is made of, for example, a silicon oxide film or the like.

Next, as shown in FIG. 67, the dummy gate electrode 5c exposed from the insulating film 31 is removed by etching. Thereby, an opening portion 32 is formed in the insulating film 31. The insulating film 4a on a bottom portion of the opening portion 32 is removed according to the removal step of the dummy gate electrode 5c and steps subsequent thereto. Since the line edge roughness of the dummy gate electrode 5c has been reduced as described above, the line edge roughness of the opening portion 32 is also small.

Next, as shown in FIG. 68, an insulating film 4b is formed on the semiconductor substrate 1 (a p-type well) on the bottom of the opening portion 32. The insulating film 4b for gate insulating film formation is made of, for example, a silicon oxide film. The High-k film (high dielectric film) or the like can be used as the insulating film 4b for formation of a gate insulating film.

Next, a conductor film 33 is formed on the insulating film 31 so as to embed the opening portion 32. The conductor film 33 is made of, for example, metal material.

Next, as shown in FIG. 69, a CMP processing is applied to the conductor film 33, the conductor film 33 is left in the opening portion 32, and the other conductor film 33 is removed. A gate electrode 5d is formed from the conductor film 33 embedded in the opening portion 32. The gate electrode 5d is a metal gate electrode, for example. The insulating film 4b below the gate electrode 5d constitutes a gate insulating film.

Since the line edge roughness of the opening portion 32 is small as described above, the line edge roughness of the gate electrode 5d made of the conductor film 33 embedded in the opening portion 32 also becomes small.

Thereafter, as shown in FIG. 70, an insulating film 34 made of, for example, a silicon oxide film is formed on the insulating film 31 embedded with the gate electrode 5d. Steps subsequent thereto are similar to those in the first embodiment, where a contact hole 12, a plug 13, an interconnect 14, and the like are formed.

In the present embodiment, since the line edge roughness of the resist pattern 22 is reduced by performing the deposition step of the passivation film 23 at step S4 and the etching step of the passivation film 23 at step S5c and the dummy gate electrode 5c is formed by dry-etching the polycrystalline silicon film 5 using the resist pattern 22 with the reduced line edge roughness as the etching mask like the first embodiment, the line edge roughness of the dummy gate electrode 5a can be reduced. Since the gate electrode 5d is formed by embedding the conductor film 33 in the opening portion 32 formed by removing the dummy gate electrode 5c with the reduced line edge roughness, the gate electrode 5d with the reduced line edge roughness can be formed. Since the size of the resist pattern and the line edge roughness reduction amount can be controlled independently of each other and the resist remaining film amount can be secured sufficiently, the process size of a gate electrode with reduced line edge roughness can be controlled at high process precision. Accordingly, performance of a semiconductor device can be improved. Productivity of a semiconductor device can be improved and manufacture yield of a semiconductor device can be improved.

In the present embodiment, the case that the gate electrode is processed mainly using the resist pattern as the etching mask has been explained as the example, but the present invention is not limited to the example. The present invention can be applied to various semiconductor device manufacturing methods for etching a layer to be processed using a resist pattern as an etching mask. For example, the present invention can be applied to overall dry-etching method using a resist pattern as an etching mask for hard mask formation, metal interconnect formation, Si trench formation, formation of an opening portion (a hole or a groove, for example, a contact hole, a through-hole, a wiring groove, or the like) in an insulating film.

For example, in the hard mask formation of the sixth embodiment, since the process size and the line edge roughness reduction amount of the hard mask can be controlled by application of the present invention, the process size and the line edge roughness reduction amount can be controlled independently even the gate electrode formation using the hard mask. Similarly, in the Si trench formation in the eighth embodiment, since the line edge roughness can be reduced, the process precision of the device isolation layer owing to the Si trench is improved so that improvement of device performance such as lowering of leak current can be expected. In the metal interconnect formation of the ninth embodiment, since the process size and the line edge roughness reduction amount can be controlled independently, improvement of device performance obtained from relaxation of local electric field concentration, suppress of breaking, and the like owing to line edge roughness reduction can be expected. In the opening portion formation in the insulating film of the tenth embodiment, the process size of the opening portion and the line edge roughness reduction amount can be controlled by application of the present invention. As a result, when an embedding copper interconnect is formed in the opening portion at a step subsequent to the opening portion formation, improvement in electric characteristic can be expected. When the formation of the opening portion of the tenth embodiment is applied to a contact hole, since a contact hole diameter and line edge roughness of a contact hole shape can be controlled, improvement in electric characteristic such as relaxation of local electric field concentration due to line edge roughness can be expected.

Thus, since the step of forming the passivation film so as to cover the resist pattern, the step of removing (etching) at least one portion of the passivation film, and the step of etching the layer to be processed using the resist pattern and the remaining portion (the residual film) of the passivation film as the etching mask which constitute the gist of the present invention are provided, the process size and the line edge roughness reduction amount can be controlled independently not only in the gate electrode formation step but also steps such as hard mask formation, metal interconnect formation, Si trench formation, opening portion (a hole or a groove, for example, a contact hole or an interconnect groove) in insulating film, and the like.

In the foregoing, the invention made by the inventors of the present invention has been concretely described based on the embodiments. However, it is needless to say that the present invention is not limited to the foregoing embodiments and various modifications and alterations can be made within the scope of the present invention.

In the above embodiments, the semiconductor device having an MISFET has been explained, but the present invention is not limited to the same. The present invention can be applied to various semiconductor device manufacturing methods having a step of etching a layer to be processed using a resist pattern.

INDUSTRIAL APPLICABILITY

The present invention is useful in application to a semiconductor device manufacturing method having a step of etching a layer to be processed using a resist pattern as an etching mask.

The invention claimed is:

1. A semiconductor device manufacturing method comprising:
    (a) a step of preparing a semiconductor substrate having a layer to be processed,
    (b) a step of forming a resist pattern on the layer to be processed,
    (c) a step of smoothing a sidewall of the resist pattern by forming a first material film on the layer to be processed so as to cover the sidewall of the resist pattern and to fill in concavities in an outer surface of the sidewall of the resist pattern and, subsequently, removing at least one portion of the first material film while another portion of the first material film remains in said concavities in the outer surface of the sidewall of the resist pattern to thereby provide a smoother outer surface for said sidewall of said resist pattern to reduce line edge roughness of the resist pattern, which smoother outer surface is comprised of the sidewall of the resist pattern and said another portion of the first material film that remains in said concavities, and
    (d) a step of, after the step (c), etching the layer to be processed using the resist pattern and the another portion of the first material film that remains in said concavities as an etching mask.

2. The semiconductor device manufacturing method according to claim 1, wherein
    in the step (c), the first material film is formed by plasma using gas containing fluorocarbon gas.

3. The semiconductor device manufacturing method comprising;
    (a) a step of preparing a semiconductor substrate having a layer to be processed,
    (b) a step of forming a resist pattern on the layer to be processed,
    (c) a step of smoothing a sidewall of the resist pattern by forming a first material film on the layer to be processed so as to cover the sidewall of the resist pattern and to fill in concavities in an outer surface of the sidewall of the resist pattern and, subsequently, removing at least one portion of the first material film while another portion of the first material film remains in said concavities in the outer surface of the sidewall of the resist pattern to thereby provide a smoother outer surface for said sidewall of said resist pattern to reduce line edge roughness of the resist pattern, which smoother outer surface is comprised of the sidewall of the resist pattern and said another portion of the first material film that remains in said concavities, and
    (d) a step of, after the step (c), etching the layer to be processed using the resist pattern and the another portion of the first material film that remains in said concavities as an etching mask,
wherein
    in the step (c), a bias voltage is applied to the semiconductor substrate to selectively etch concavities of another surface of the first material film and to increase fluidity of the first material film to fill the concavities of the other surface of the sidewall of the resist pattern to smooth said outer surface of the resist pattern.

4. The semiconductor device manufacturing method according to claim 3, wherein
    in the step (c), the bias voltage is applied to the semiconductor substrate while the first material film is being formed to cover the sidewall of the resist pattern.

5. The semiconductor device manufacturing method according to claim 1, wherein
    a temperature difference within the semiconductor substrate at the step (c) is smaller than a temperature difference within the semiconductor substrate at the step (d).

6. The semiconductor device manufacturing method according to claim 1, wherein
    an in-plane distribution in the semiconductor substrate of an etching rate of the first material film during removal of the at least one portion of the first material film is controlled according to an in-plane distribution in the semiconductor substrate of a deposition film thickness of the first material film during covering of the resist pattern with the first material film.

7. The semiconductor device manufacturing method according to claim 1, wherein
    the layer to be processed comprises a silicon layer, a metal material layer, or an insulating layer.

8. The semiconductor device manufacturing method according to claim 1, wherein
    the steps (b) to (d) are performed for forming a gate electrode.

9. The semiconductor device manufacturing method according to claim 3, wherein, in the step (c), the bias voltage is applied to the semiconductor substrate while the at least one portion of the first material film is being removed from the resist pattern.

10. The semiconductor device manufacturing method according to claim 4, wherein, in the step (c), the bias voltage is applied to the semiconductor substrate while the at least one portion of the first material film is being removed from the resist pattern.

* * * * *